(12) United States Patent
Shibazaki

(10) Patent No.: US 9,223,225 B2
(45) Date of Patent: Dec. 29, 2015

(54) LIQUID IMMERSION MEMBER, EXPOSURE APPARATUS, EXPOSURE METHOD, AND DEVICE MANUFACTURING METHOD

(75) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 790 days.

(21) Appl. No.: 13/520,963

(22) PCT Filed: Dec. 28, 2010

(86) PCT No.: PCT/JP2010/073677
§ 371 (c)(1),
(2), (4) Date: Mar. 12, 2013

(87) PCT Pub. No.: WO2011/083724
PCT Pub. Date: Jul. 14, 2011

(65) Prior Publication Data
US 2013/0188159 A1    Jul. 25, 2013

Related U.S. Application Data

(60) Provisional application No. 61/282,255, filed on Jan. 8, 2010.

(51) Int. Cl.
*G03B 27/52* (2006.01)
*G03B 27/42* (2006.01)
*G03F 7/20* (2006.01)

(52) U.S. Cl.
CPC .................... *G03F 7/70341* (2013.01)

(58) Field of Classification Search
CPC .................................................. G03F 7/70341
USPC ....................................................... 355/30, 53
See application file for complete search history.

(56) References Cited

U.S. PATENT DOCUMENTS 6,208,407 B1   3/2001   Loopstra
6,262,796 B1   7/2001   Loopstra et al.
(Continued)

FOREIGN PATENT DOCUMENTS

JP   A-2008-244477   10/2008
JP   A-2009-088037   4/2009
(Continued)

OTHER PUBLICATIONS

Jul. 15, 2014 Office Action issued in Japanese Application No. 2011-548968 (with translation).
(Continued)

*Primary Examiner* — Hung Henry Nguyen
(74) *Attorney, Agent, or Firm* — Oliff PLC

(57) ABSTRACT

A liquid immersion member forms a liquid immersion space between the member and a movable object such that an optical path of exposure light is filled with liquid. The liquid immersion member includes: a first plate that is disposed at least partially around the optical path; a second plate that is disposed at least partially around the optical path, and has an upper surface, opposed to at least a part of a lower surface of the first plate, and a lower surface which can be opposed to the object; and a collection port that is disposed outside the first plate with respect to the optical path, can be at least partially opposed to the object, and collects at least some of the liquid from a first space, which the upper surface of the second plate faces, and a second space which the lower surface of the second plate faces.

23 Claims, 11 Drawing Sheets

(56) References Cited

U.S. PATENT DOCUMENTS

| | | |
|---|---|---|
| 6,341,007 B1 | 1/2002 | Nishi et al. |
| 6,452,292 B1 | 9/2002 | Binnard |
| 6,611,316 B2 | 8/2003 | Sewell |
| 6,778,257 B2 | 8/2004 | Bleeker et al. |
| 6,897,963 B1 | 5/2005 | Taniguchi et al. |
| 7,251,013 B2 * | 7/2007 | Ten Kate et al. ................. 355/30 |
| 7,474,379 B2 * | 1/2009 | Donders et al. ................. 355/53 |
| 8,068,209 B2 | 11/2011 | Poon et al. |
| 8,233,139 B2 * | 7/2012 | Nishii ............................. 355/53 |
| 8,237,911 B2 | 8/2012 | Poon et al. |
| 8,610,873 B2 | 12/2013 | Poon et al. |
| 2006/0103817 A1 | 5/2006 | Ten Kate et al. |
| 2007/0127006 A1 | 6/2007 | Shibazaki |
| 2007/0177125 A1 | 8/2007 | Shibazaki |
| 2008/0049209 A1 | 2/2008 | Nagasaka et al. |
| 2008/0233512 A1 | 9/2008 | Nishii et al. |

FOREIGN PATENT DOCUMENTS

| | | |
|---|---|---|
| JP | A-2009-246375 | 10/2009 |
| WO | WO 01/35168 A1 | 5/2001 |
| WO | WO 2004/019128 A2 | 3/2004 |

OTHER PUBLICATIONS

International Search Report issued in International Patent Application No. PCT/JP2010/073677 dated Apr. 5, 2011 (with translation).

Written Opinion issued in International Patent Application No. PCT/JP2010/073677 dated Apr. 5, 2011 (with translation).

Office Action issued in Chinese Patent Application No. 201080060647.3 dated Jun. 18, 2014. (with translation).

Mar. 11, 2015 Office Action issued in Chinese Application No. 201080060647.3.

* cited by examiner

FIG. 3
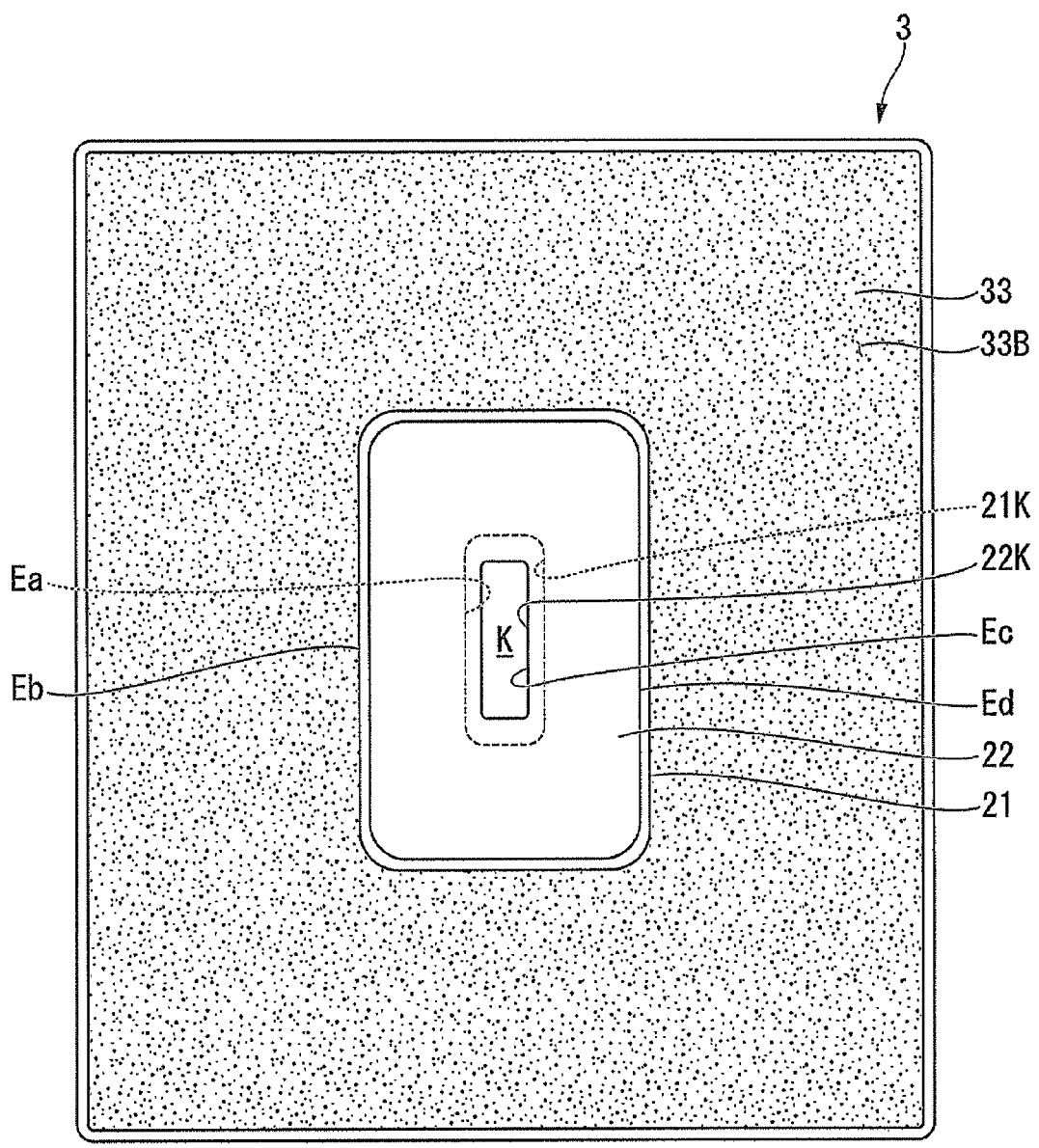
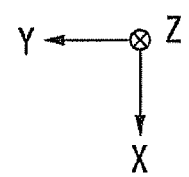

FIG. 9
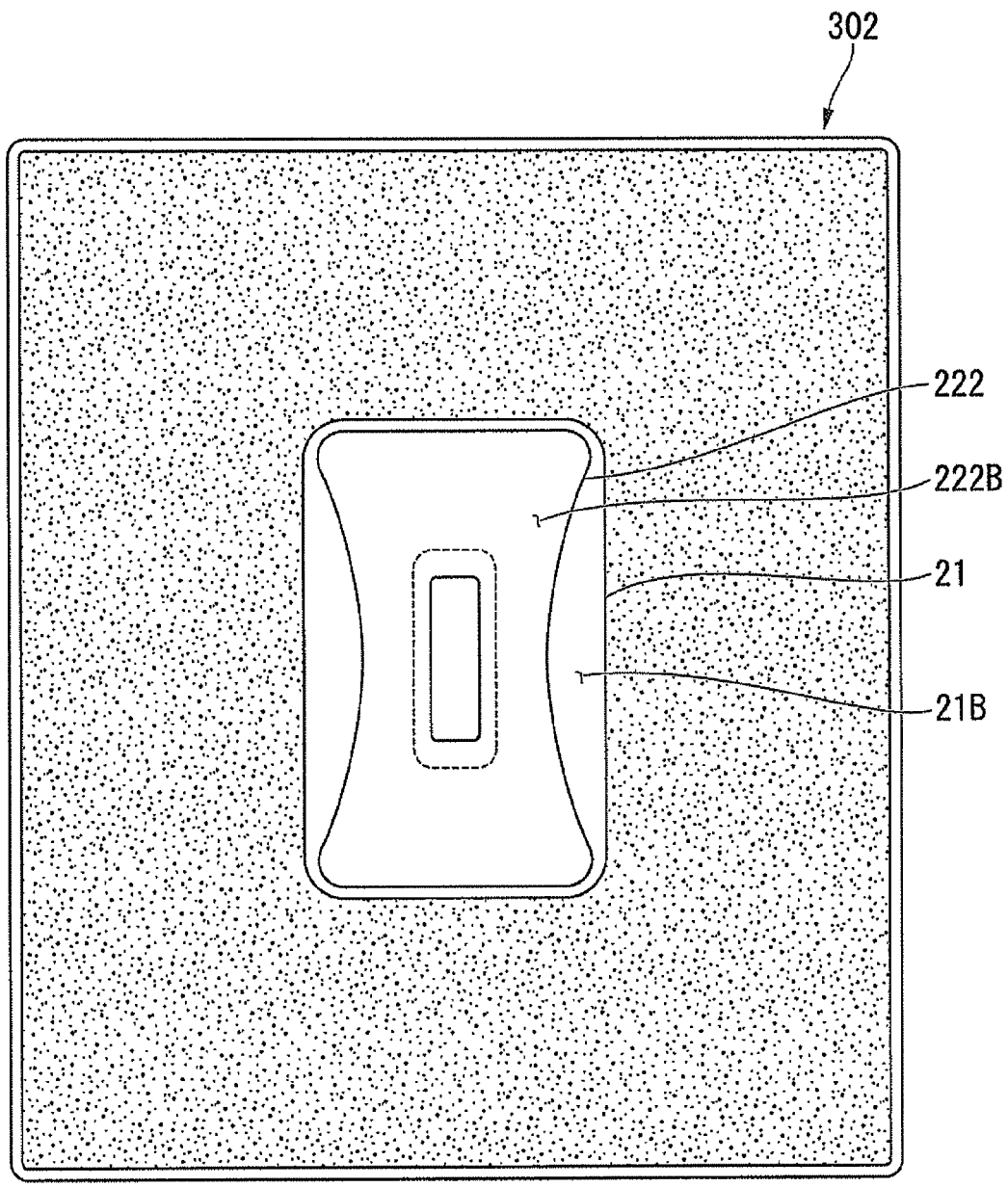
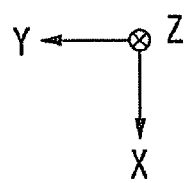

LIQUID IMMERSION MEMBER, EXPOSURE APPARATUS, EXPOSURE METHOD, AND DEVICE MANUFACTURING METHOD

Priority is claimed on U.S. Provisional Application No. 61/282,255, filed on Jan. 8, 2010, the contents of which are incorporated herein by reference.

TECHNICAL FIELD

The present invention relates to a liquid immersion member, an exposure apparatus, an exposure method, and a device manufacturing method.

BACKGROUND

As an exposure apparatus used in a photolithography process, for example, as disclosed in the following patent document, an immersion exposure apparatus that exposes a substrate with exposure light through liquid is known.

RELATED ART DOCUMENTS

Patent Documents

[Patent Document 1] U.S. Patent Application Publication No. 2006/0103817

SUMMARY OF INVENTION

Problems to be Solved by the Invention

In immersion exposure apparatuses, in a state where a liquid immersion space is formed on an object such as a substrate, for example, when an object is moved at a high velocity, or when it is moved by a long distance, there is a possibility that liquid flows out or liquid (a film, droplets, and the like) remains on the object. As a result, there is a possibility that exposure failures occur or a defective device is produced.

According to an aspect of the present invention, it is an object to provide a liquid immersion member, an exposure apparatus, and an exposure method capable of preventing exposure failures from occurring. Further, according to another aspect of the present invention, it is an object to provide a device-manufacturing method capable of preventing a defective device from being produced.

Means for Solving the Problem

According to a first aspect of the invention, there is provided a liquid immersion member that forms a liquid immersion space between the member and a movable object such that an optical path of exposure light is filled with liquid. The liquid immersion member includes: a first plate that is disposed at least partially around the optical path; a second plate that is disposed at least partially around the optical path, and has an upper surface, which is opposed to at least a part of a lower surface of the first plate, and a lower surface which can be opposed to the object; and a collection port that is disposed outside the first plate with respect to the optical path, can be at least partially opposed to the object, and collects at least some of the liquid from a first space, which the upper surface of the second plate faces, and a second space which the lower surface of the second plate faces.

According to a second aspect of the present invention, there is provided an exposure apparatus that exposes a substrate with exposure light through liquid. The exposure apparatus includes the liquid immersion member of the first aspect.

According to a third aspect of the present invention, there is provided a device manufacturing method including: exposing a substrate using the exposure apparatus of the second aspect; and developing the exposed substrate.

According to a fourth aspect of the present invention, there is provided an exposure method of exposing a substrate with exposure light through liquid. The exposure method includes: forming a liquid immersion space such that an optical path of exposure light between an emission surface of an optical member and a front surface of the substrate is filled with the liquid; irradiating the substrate with the exposure light from the emission surface through the liquid of the liquid immersion space; and collecting at least some of the liquid from a first space between a lower surface of a first plate, which is disposed at least partially around the optical path, and an upper surface of a second plate, which is disposed at least partially around the optical path, and a second space between a lower surface of the second plate and a front surface of the substrate, through a collection port which is disposed outside the first plate with respect to the optical path and can be at least partially opposed to the substrate.

According to a fifth aspect of the present invention, there is provided a device manufacturing method including: exposing a substrate using the exposure method of the fourth aspect; and developing the exposed substrate.

Advantage of the Invention

According to some aspects of the present invention, it is possible to prevent exposure failures from occurring. Further, according to some aspects of the present invention, it is possible to prevent a defective device being produced.

BRIEF DESCRIPTION OF THE DRAWINGS

FIG. 3 is a diagram illustrating an example of the liquid immersion member according to the first embodiment as viewed from the lower side thereof.

FIG. 9 is a diagram illustrating an example of the liquid immersion member according to the first embodiment as viewed from the lower side thereof.

DESCRIPTION OF EMBODIMENTS

Hereinafter, embodiments of the present invention will be described with reference to the drawings, but the present invention is not limited to these embodiments. In the following descriptions, an XYZ orthogonal coordinate system is established, and the positional relationships of members are described with reference to this XYZ orthogonal coordinate system. A prescribed direction in the horizontal plane is taken to be the X-axis direction; the direction in the horizontal plane perpendicular to the X-axis direction is taken to be the Y-axis direction; and the direction (that is, the vertical direction) perpendicular to both the X-axis direction and the Y-axis direction is taken to be the Z-axis direction. The rotation (inclination) directions about the X axis, Y axis, and Z axis are respectively the $\theta X$, $\theta Y$, and $\theta Z$ directions.

First Embodiment

Figure 1:
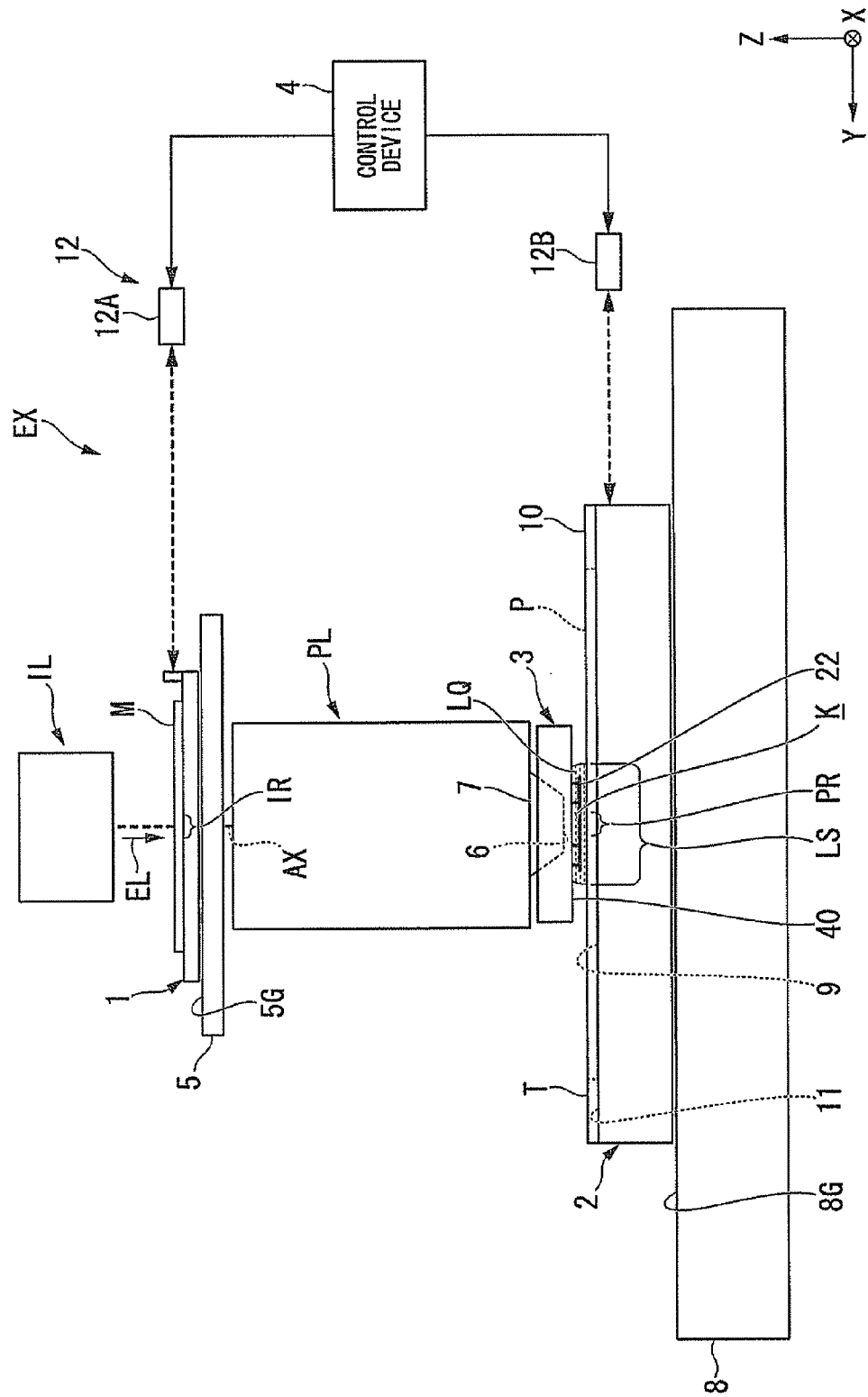
FIG. 1 is a schematic configuration diagram illustrating an example of an exposure apparatus according to a first embodiment.

The first embodiment will be described. FIG. 1 is a schematic configuration diagram illustrating an example of an exposure apparatus EX according to the first embodiment. The exposure apparatus EX of the present embodiment is an immersion exposure apparatus which exposes a substrate P with exposure light EL through a liquid LQ. In the present embodiment, a liquid immersion space LS is formed such that at least a part of the optical path of the exposure light EL is filled with the liquid LQ. The liquid immersion space is a section (space, region) filled with the liquid. The substrate P is exposed with the exposure light EL through the liquid LQ of the liquid immersion space LS. In the present embodiment, water (pure water) is used as the liquid LQ.

In FIG. 1, the exposure apparatus EX has a mask stage 1 which is able to move while holding a mask M; a substrate stage 2 which is able to move while holding the substrate P; an illumination system IL which illuminates the mask M with exposure light EL; a projection optical system PL which projects an image of a pattern of the mask M, illuminated with exposure light EL, onto the substrate P; a liquid immersion member 3 which forms the liquid immersion space LS between itself and the substrate P such that the optical path K of the exposure light EL with which the substrate P is irradiated is filled with the liquid LQ; and a control device 4 which controls operations of the entire exposure apparatus EX.

The mask M includes reticles on which are formed device patterns for projection onto the substrate P. The mask M includes, for example, a transparent plate such as a glass plate, and a transmissive mask which has a pattern formed on the transparent using a light shielding material such as chromium. In addition, as the mask M, a reflective mask may be used.

The substrate P is a substrate used to manufacture devices. The substrate P includes, for example, a base such as a semiconductor wafer and a photosensitive film formed on the base. A photosensitive film is a film of a photosensitive material (photoresist). Further, the substrate P may include a separate film in addition to the photosensitive film. For example, the substrate P may include an antireflective film, and may include a protective film (topcoat film) which protects the photosensitive film.

The illumination system IL irradiates the exposure light EL to a prescribed illumination region IR. The illumination region IR includes a position to which the exposure light EL emitted from the illumination system IL can be irradiated.

The illumination system IL illuminates at least a part of the mask M, which is disposed on the illumination region IR, with the exposure light EL having a uniform luminous flux intensity distribution. As the exposure light EL emitted from the illumination system IL, for example, bright lines (g-line, h-line, i-line) emitted from a mercury lamp, deep ultraviolet (DUV) light such KrF excimer laser light (wavelength 248 nm), and vacuum ultraviolet (VUV) light such as ArF excimer laser light (wavelength 193 nm), and F2 laser light (wavelength 157 nm) may be used. In the present embodiment, ArF excimer laser light, which is ultraviolet light (vacuum ultraviolet light), is used as the exposure light EL.

The mask stage 1 is able to move, while holding the mask M, on a guiding surface 5G of a base member 5 including the illumination region IR. The mask stage 1 is moved by an operation of a driving system including a planar motor disclosed in, for example, U.S. Pat. No. 6,452,292. The planar motor has a slider, which is disposed on the mask stage 1, and a stator which is disposed on the base member 5. In the present embodiment, the mask stage 1 is capable of moving in six directions along the guiding surface 5G, that is, the X axis, Y axis, Z axis, $\theta X$, $\theta Y$, and $\theta Z$ directions, by the operation of the driving system.

The projection optical system PL irradiates the exposure light EL to a prescribed projection region PR. The projection region PR includes a position to which the exposure light EL emitted from the projection optical system PL can be irradiated. The projection optical system PL projects with a prescribed projection magnification an image of the pattern of the mask M to at least a part of the substrate P, which is disposed in the projection region PR. The projection optical system PL of the present embodiment is a reduction system that has a projection magnification of, for example, ¼, ⅕, or ⅛. Furthermore, the projection optical system PL may be a unity magnification system or an enlargement system. In the present embodiment, an optical axis AX of the projection optical system PL is parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

The projection optical system PL has an emission surface 6 from which the exposure light EL is emitted and travels toward an image plane of the projection optical system PL. The emission surface 6 belongs to a terminal optical element 7, which is closest to the image plane of the projection optical system PL, among the optical element of the plurality of optical elements of the projection optical system. PL. The projection region PR includes a position to which the exposure light EL emitted from the emission surface 6 can be irradiated. In the present embodiment, the emission surface 6 faces the –Z direction and is parallel to the XY plane. Further, the emission surface 6, which faces the –Z direction, may be a convex or concave surface. The exposure light EL emitted from the emission surface 6 travels in the –Z direction.

The substrate stage 2 is able to move, while holding the substrate P, on a guiding surface 8G of a base member 8 which includes the projection region PR. The substrate stage 2 is moved by the operation of driving system including a planar motor disclosed in, for example, U.S. Pat. No. 6,452,292. The planar motor has a slider, which is disposed on the substrate stage 2, and a stator which is disposed on the base member 8. In the present embodiment, the substrate stage 2 is capable of moving in six directions along the guiding surface 8G, that is, the X axis, Y axis, Z axis, θX, θY, and θZ directions, by the operation of the driving system.

The substrate stage 2 has a substrate holding section 9 which releasably holds the substrate P. The substrate holding section 9 holds the substrate P such that the front surface thereof faces the +Z direction. In the present embodiment, the substrate holding section 9 holds the substrate P such that the front surface of the substrate P and the XY plane are substantially parallel to each other. In the present embodiment, the front surface of the substrate P held by the substrate holding section 9 and an upper surface 10 of the substrate stage 2 disposed around the substrate P are disposed within the same plane (disposed to be coplanar). The upper surface 10 is flat. In the present embodiment, the front surface of the substrate P, which is held by the substrate holding section 9, and the upper surface 10 of the substrate stage 2 are substantially parallel to the XY plane.

Further, in the present embodiment, the substrate stage 2 includes a plate member holding section 11 which releasably holds a plate member T as disclosed in, for example, U.S. Patent Application Publication No. 2007/0177125 and U.S. Patent Application Publication No. 2008/0049209. In the present embodiment, the upper surface 10 of the substrate stage 2 includes an upper surface of the plate member T which is held by the plate member holding section 11.

Furthermore, the plate member T may not be releasable. In such a case, the plate member holding section 11 can be omitted. In addition, the front surface of the substrate P, which is held by the substrate holding section 9, and the upper surface 10 thereof may not be disposed within the same plane, and at least one of the front surface of the substrate P and the upper surface 10 may not be parallel to the XY plane.

In the present embodiment, an interferometer system 12, which includes laser interferometer units 12A and 12B, measures the positions of the mask stage 1 and the substrate stage 2. The laser interferometer unit 12A is capable of measuring the position of the mask stage 1 using measurement mirrors which are disposed on the mask stage 1. The laser interferometer unit 12B is capable of measuring the position of the substrate stage 2 using measurement mirrors which are disposed on the substrate stage 2. When an exposure process or a prescribed measurement process is performed on the substrate P, the control device 4 controls the positions of the mask stage 1 (the mask M) and the substrate stage 2 (the substrate P) on the basis of the measurement results of the interferometer system 12.

In the present embodiment, the exposure apparatus EX is a scanning type exposure apparatus (a so-called scanning stepper) that projects the image of the pattern of the mask M onto the substrate P while synchronously moving the mask M and the substrate P in prescribed scanning directions. In the present embodiment, the scanning direction (the synchronous movement direction) of the substrate P is set to the Y axis direction, and the scanning direction (the synchronous movement direction) of the mask M is also set to the Y axis direction. The control device 4 irradiates the substrate P with the exposure light EL through the projection optical system PL and the liquid LQ in the immersion space LS above the substrate P while moving the substrate P in the Y axis direction relative to the projection region PR of the projection optical system PL and moving the mask M in the Y axis direction relative to the illumination region IR of the illumination system IL in synchronization with the movement of the substrate P in the Y axis direction.

Figure 2:
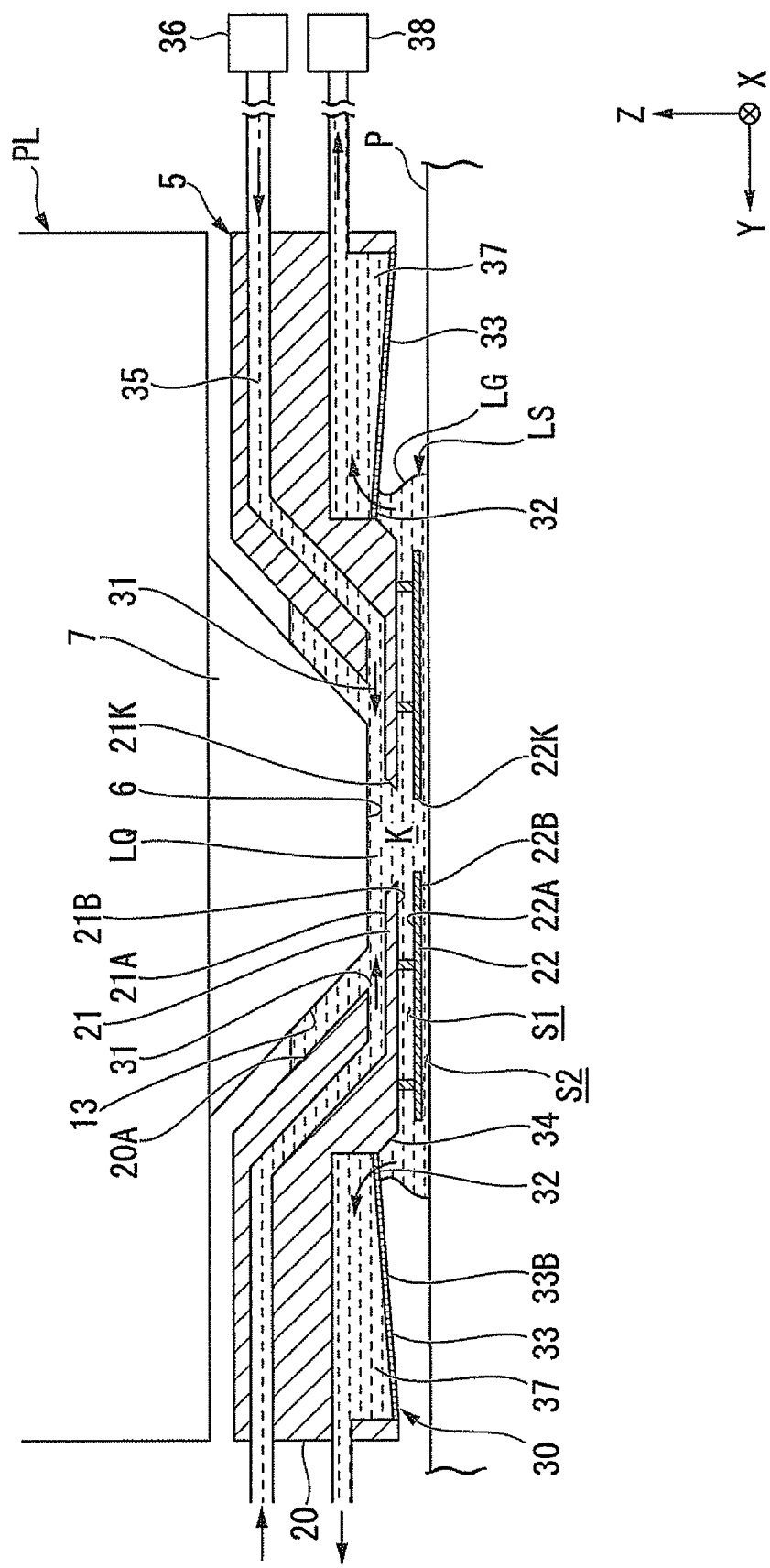
FIG. 2 is a side cross-sectional view illustrating an example of a liquid immersion member according to the first embodiment.
Figure 4:
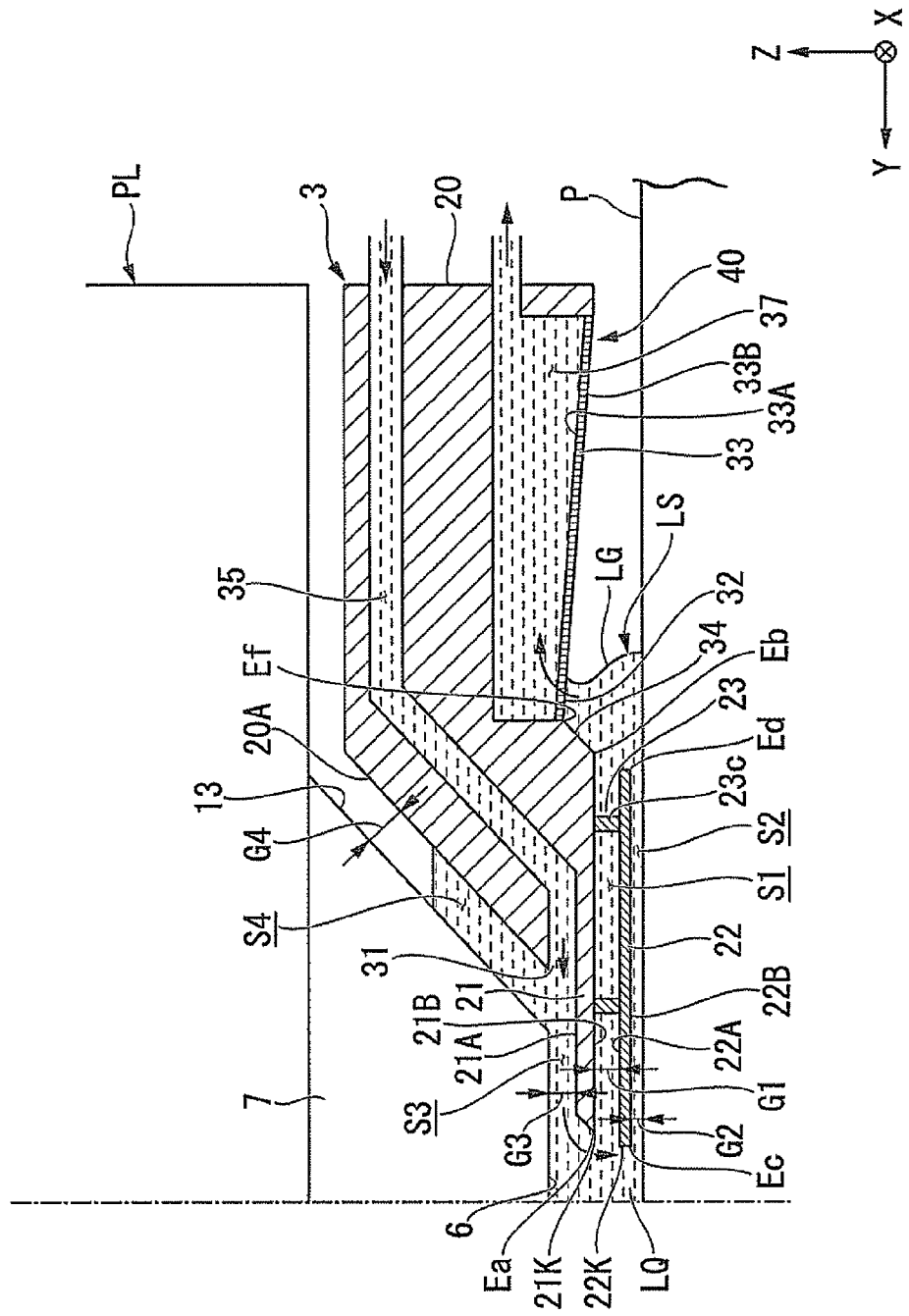
FIG. 4 is a diagram illustrating a part of FIG. 2 in an enlarged manner.
Figure 5:
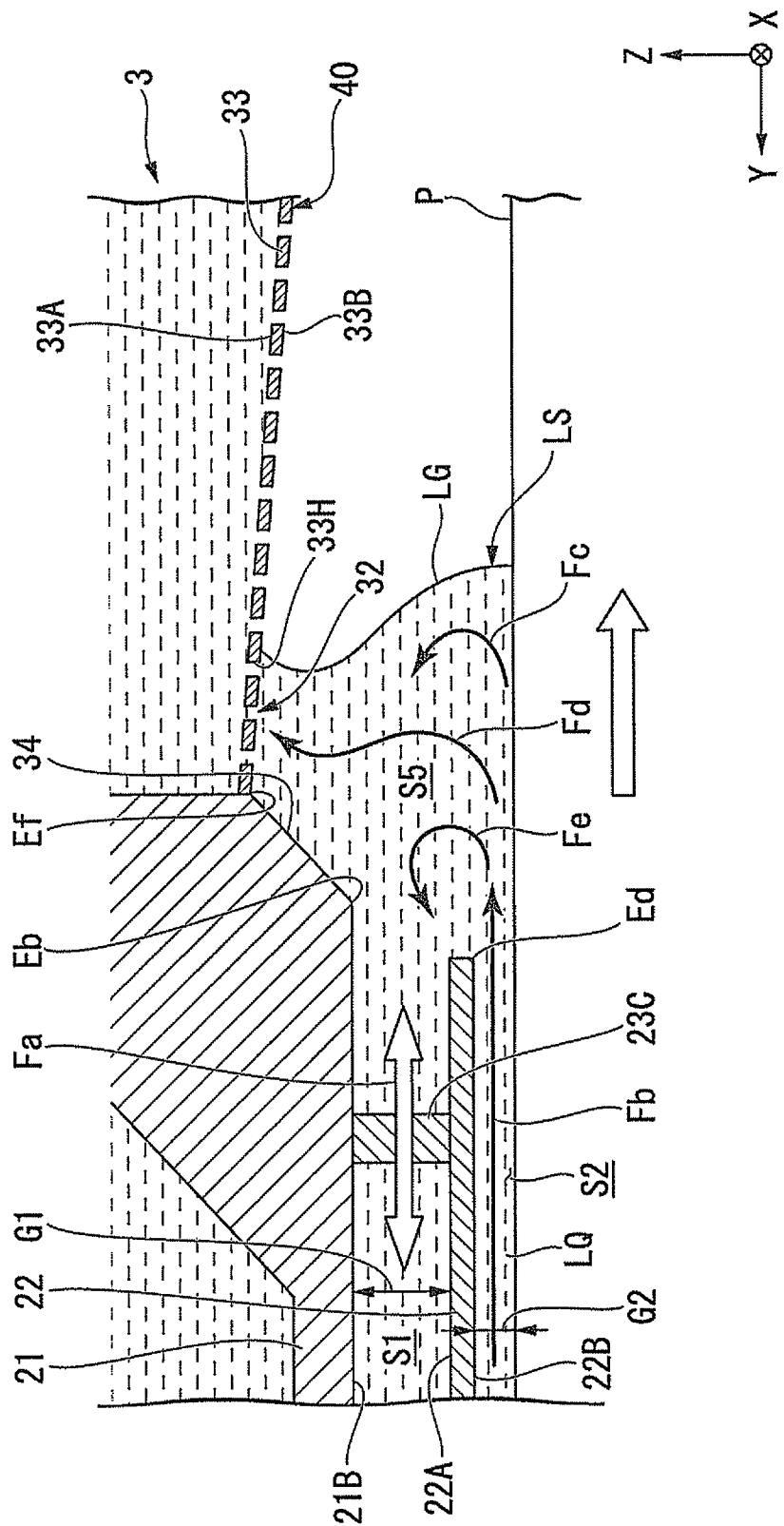
FIG. 5 is a diagram illustrating a part of FIG. 4 in an enlarged manner.

Next, referring to FIGS. 2 to 5, the liquid immersion member 3 will be described. FIG. 2 is a side cross-sectional view illustrating an example of the liquid immersion member 3 according to the present embodiment. FIG. 3 is a diagram illustrating an example of the liquid immersion member 3 as viewed from the −Z side (the lower side). FIG. 4 is a diagram illustrating a part of FIG. 2 in an enlarged manner. FIG. 5 is a diagram illustrating a part of FIG. 4 in an enlarged manner.

The liquid immersion member 3 forms the immersion space LS by holding the liquid LQ between itself and an object, which is disposed in the projection region PR, such that the optical path K of the exposure light EL irradiated to the object is filled with the liquid LQ. The liquid immersion space LS is formed such that the optical path K of the exposure light EL between the terminal optical element 7 and the object is filled with the liquid LQ. In the present embodiment, the object, which can be disposed in the projection region PR, includes an object which is movable in the projection region PR. In the present embodiment, the object includes at least one of the substrate stage 2 (the plate member T) and the substrate P which is held by the substrate stage 2. The liquid immersion member 3 forms the liquid immersion space LS between itself and the movable object such that the optical path K of the exposure light EL is filled with the liquid LQ. In the exposure of the substrate P, the liquid immersion member 3 holds the liquid LQ between itself and the substrate P such that the optical path K of the exposure light EL with which the substrate P is irradiated is filled with the liquid LQ, thereby forming the liquid immersion space LS. In the following description referring to FIGS. 2 to 5, a description will be given of an exemplary case where the liquid immersion member 3 forms the liquid immersion space LS between itself and the substrate P. However, the liquid immersion space LS may be formed between itself and, for example, the substrate stage 2 (the plate member T).

In the present embodiment, the liquid immersion member 3 includes: a first plate section 21 that is disposed at least partially around the optical path K of the exposure light EL emitted from the emission surface 6; a second plate section 22 that is disposed at least partially around the optical path K, and has an upper surface 22A, of which at least a part is opposed to a lower surface 21B of the first plate section 21, and a lower surface 22B which can be opposed to the substrate P (the object); and a collection port 32 that is disposed outside the first plate section 21 with respect to the optical path K, can be at least partially opposed to the substrate P, and collects at least some of the liquid from a first space S1, which the upper surface 22A of the second plate section 22 faces, and a second space S2 which the lower surface 22B of the second plate section 22 faces. Further, the liquid immersion member 3 includes a main body section 20 of which at least a part is disposed around the terminal optical element 7. In the present embodiment, the main body section 20 and the first plate section 21 are formed as a single body. The second plate section 22 and the first plate section 21 are formed as separate bodies.

In the present embodiment, the main body section 20 and the first plate section 21 are annular members. At least a part of the main body section 20 is disposed around the terminal optical element 7. The first plate section 21 is disposed around the optical path K. Further, in the present embodiment, the second plate section 22 is also an annular member. The second plate section 22 is disposed around the optical path K.

In addition, at least one of the main body section 20, the first plate section 21, and the second plate section 22 may not be an annular member. For example, the second plate section 22 may be disposed partially around the optical path K.

The main body section 20 has an inner surface 20A which is opposed to a side surface 13 of the terminal optical element 7. The side surface 13 is disposed around the emission surface 6. The side surface 13 is a surface from which the exposure light EL is not emitted. In the present embodiment, the side surface 13 is inclined in the +Z direction toward the outside in the radiation direction of the optical path K. The +Z direction is a direction opposite to a direction (the −Z direction) in which the exposure light EL emitted from the emission surface 6 travels.

The first plate section 21 has an upper surface 21A and the lower surface 21B which is opposite to the upper surface 21A. The upper surface 21A faces toward the +Z direction. The lower surface 21B faces toward the −Z direction. At least a part of the upper surface 21A is opposed to the emission surface 6. Further, the first plate section 21 has an opening 21K through which the exposure light EL emitted from the emission surface 6 can be transmitted. The upper surface 21A and the lower surface 21B are disposed around the optical path K (the opening 21K).

In the present embodiment, the upper surface 21A is flat, and is substantially parallel to the XY plane. The lower surface 21B is flat, and is substantially parallel to the XY plane. In addition, the upper surface 21A and the lower surface 21B may not be parallel to each other, and may be different in thickness in the Z axis direction.

The second plate section 22 has the upper surface 22A and the lower surface 22B which is opposite to the upper surface 22A. The upper surface 22A faces toward the +Z direction. The lower surface 22B faces toward the −Z direction. At least a part of the upper surface 22A is opposed to the lower surface 21B. The substrate P can be opposed to the lower surface 22B. Further, the second plate section 22 has an opening 22K through which the exposure light EL emitted from the emission surface 6 can be transmitted. The upper surface 22A and the lower surface 22B are disposed around the optical path K (the opening 22K).

In the exposure of the substrate P, the exposure light EL emitted from the emission surface 6 is transmitted through the opening 21K and the opening 22K, and the substrate P is irradiated therewith.

In the present embodiment, the upper surface 22A is flat, and is substantially parallel to the XY plane. The lower surface 22B is flat, and is substantially parallel to the XY plane. In the present embodiment, the lower surface 21B of the first plate section 21 and the upper surface 22A of the second plate section 22 are substantially parallel to each other. In addition, the upper surface 22A and the lower surface 22B may not be parallel to each other, and may be different in thickness in the Z axis direction.

In addition, the lower surface 21B and the upper surface 22A may be not parallel to each other. In addition, at least one of the upper surface 21A and the lower surface 21B may not be parallel to the XY plane. Further, at least one of the upper surface 21A and the lower surface 21B may include a curved surface. Further, at least one of the upper surface 22A and the lower surface 22B may not be parallel to the XY plane. Further, at least one of the upper surface 22A and the lower surface 22B may include a curved surface.

The liquid immersion member 3 is disposed such that at least a part of the inner surface 20A and the side surface 13 are opposed to each other with a gap G4 interposed therebetween. Further, the liquid immersion member 3 is disposed such that at least a part of the upper surface 21A and the emission surface 6 are opposed to each other with a gap G3 interposed therebetween. Further, the second plate section 22 is disposed such that at least a part of the upper surface 22A and the lower surface 21B are opposed to each other with a gap G1 interposed therebetween. The substrate P is disposed such that the front surface of the substrate P and the lower surface 22B are opposed to each other with a gap G2 interposed therebetween.

In the present embodiment, the first space S1 is formed between the lower surface 21B and the upper surface 22A. The second space S2 is formed between the lower surface 22B and the front surface of the substrate P. A third space S3 is formed between the emission surface 6 and the upper surface 21A. A fourth space S4 is formed between the inner surface 20A and the side surface 13.

In the present embodiment, the liquid immersion member 3 has a supporting mechanism 23 that supports the second plate section 22 such that it is disposed at a prescribed position on the first plate section 21. In the present embodiment, the supporting mechanism 23 includes a connecting member 23C that connects the second plate section 22 to the first plate section 21. The connecting member 23C is a rod-like member. A plurality of connecting members 23C is disposed in the XY plane. The supporting mechanism 23 respectively connects a plurality of positions on the lower surface 21B to a plurality of positions on the upper surface 22A by using the plurality of connecting members 23C. The supporting mechanism 23 supports the second plate section 22 such that the lower surface 21B and the upper surface 22A are opposed to each other with the gap G1 interposed therebetween.

In addition, the supporting mechanism 23 may have the connecting member that connects the main body section 20 and the second plate section 22. In this case, the connecting member 23C, which connects the first plate section 21 and the second plate section 22, may be omitted or may not be omitted. Further, the second plate section 22 may not be connected at least one of the main body section 20 and the first plate section 21. For example, a supporting member, which supports the projection optical system PL, may support the second plate section 22 through a prescribed supporting mechanism.

In the present embodiment, the gap G1 between the lower surface 21B of the first plate section 21 and the upper surface 22A of the second plate section 22 is larger than the gap G2 between the lower surface 22B of the second plate section 22 and the surface of the substrate P. In the present embodiment, the gap G2 includes a gap between the lower surface 22B of the second plate section 22 and the surface of the substrate P (the object) which is disposed on the upper surface of the projection optical system PL.

Further, in the present embodiment, the distance between the upper surface 21A and the lower surface 21B is larger than the distance between the upper surface 22A and the lower surface 22B. In other words, the first plate section 21 is thicker than the second plate section 22.

In the present embodiment, the lower surface 21B is lyophilic to the liquid LQ. In the present embodiment, the contact angle between the liquid LQ and the lower surface 21B is smaller than 90 degrees. In the present embodiment, the first plate section 21 is made of titanium. The lower surface 21B is a titanium surface.

In the present embodiment, the upper surface 22A is lyophilic to the liquid LQ. Further, in the present embodiment, the lower surface 22B is also lyophilic to the liquid LQ. The contact angle between the liquid LQ and the upper surface 22A is smaller than 90 degrees. Further, the contact angle between the liquid LQ and the lower surface 22B is smaller than 90 degrees. In the present embodiment, the second plate section 22 is made of titanium. The upper surface 22A and the lower surface 22B are titanium surfaces. In addition, the contact angle between the liquid LQ and the upper surface 22A may be different from the contact angle between the liquid LQ and the lower surface 22B. In other words, the affinity (lyophilic property) to the liquid LQ may be different between the upper surface 22A and the lower surface 22B.

Further, the contact angle between the liquid LQ and the lower surface 21B and the contact angle between the liquid LQ and the upper surface 22A may be equal to each other or may be different from each other. Further, the contact angle between the liquid LQ and the lower surface 21B and the contact angle between the liquid LQ and the lower surface 22B may be equal to each other or may be different from each other.

In addition, at least one of the upper surface 22A and the lower surface 22B may be lyophobic to the liquid LQ. For example, the contact angle between the liquid LQ and the upper surface 22A may be equal to or greater than 90 degrees, and the contact angle between the liquid LQ and the lower surface 22B may be equal to or greater than 90 degrees.

In the present embodiment, the first plate section 21 has an inner edge Ea and an outer edge Eb. The inner edge Ea is an edge close to the optical path K. The outer edge Eb is an edge far from the optical path K. The inner edge Ea defines the opening 21K.

The second plate section 22 has an inner edge Ec and an outer edge Ed. The inner edge Ec is an edge close to the optical path K. The outer edge Ed is an edge far from the optical path K. The inner edge Ec defines the opening 22K.

In the present embodiment, the inner edge Ec of the second plate section 22 is disposed inside the first plate section 21 in the radiation direction of the optical path K. That is, the inner edge Ec of the second plate section 22 is closer to the optical path K than the inner edge Ea of the first plate section 21. In the present embodiment, the opening 22K is smaller than the opening 21K.

As shown in FIG. 3, in the present embodiment, the external shape of the lower surface 21B of the first plate section 21 is substantially the same as the external shape of the lower surface 22B of the second plate section 22 in the XY plane. In the present embodiment, the external shape of the lower surface 21B and the external shape of the lower surface 22B are rectangular. In addition, the external shape of the lower surface 21B and the external shape of the lower surface 22B may be, for example, circular, or octagonal.

In the present embodiment, the collection port 32 is disposed outside the first plate section 21 with respect to the optical path K. In the present embodiment, the collection port 32 is the end portion of the opening which is formed on the main body section 20 so as to face the front surface of the substrate P. The collection port 32 is capable of collecting the liquid LQ on the substrate P.

Further, in the present embodiment, the collection port 32 is disposed outside the second plate section 22 in the radiation direction of the optical path K. In other words, the collection port 32 is disposed outside the outer edge Ed of the second plate section 22.

In the present embodiment, the collection port 32 is disposed around the optical path K (the lower surface 21B). In the present embodiment, the collection port 32 has an annular shape. In addition, the collection port 32 may be disposed partially around the optical path K. Further, a plurality of collection ports 32 may be arranged at a predetermined distance around the optical path K.

In the present embodiment, the liquid immersion member 3 includes a porous member 33 which is disposed at the collection port 32. The porous member 33 has a plurality of holes 33H through which the liquid LQ can be flowed. In the present embodiment, the porous member 33 is a plate-like member. The porous member 33 has an upper surface 33A and a lower surface 33B. The holes 33H are formed to connect the upper surface 33A and the lower surface 33B. The lower surface 33B of the porous member 33 is opposed to the front surface of the substrate P. In the present embodiment, the liquid LQ is collected from the upper side of the substrate P through the holes 33H of the porous member 33. In addition, the porous member 33 may be a mesh filter as a porous member in which numerous small holes are formed as a mesh. In the present embodiment, the lower surface 33B of the porous member 33 is disposed around the lower surface 21B. In addition, the lower surface 33B may be disposed partially around the lower surface 21B. In addition, the porous member 33 may not be disposed at the collection port 32.

In the present embodiment, the liquid immersion member 3 has an inclined surface 34 that connects an inner edge Ef of the lower surface 33B and an outer edge Eb of the lower surface 21B. The inclined surface 34 is inclined in the +Z direction outward with respect to the radiation direction of the optical path K. In the present embodiment, the inner edge Ef of the lower surface 33B is disposed to be closer to the +Z side than the outer edge Eb of the lower surface 21B. Further, in the present embodiment, the lower surface 33B is inclined in the −Z direction outward with respect to the radiation direction of the optical path K. In addition, the lower surface 33B may be inclined in the +Z direction outward with respect to the radiation direction of the optical path K. Further, the lower surface 33B may not be flat, and may be curved or may have differences in level.

In the following description, the lower surface 21B, the inclined surface 34, and the lower surface 33B are collectively referred to as a lower surface 40. The front surface of the substrate P, which is disposed in the projection region PR, can be opposed to at least a part of the lower surface 40.

The lower surface 40 is able to hold the liquid LQ between itself and the front surface of the substrate P. By holding the liquid LQ between the emission surface 6 and the lower surface 40 on one side and the front surface of the substrate P on the other side, the liquid immersion space LS is formed such that the optical path of the exposure light EL between the terminal optical element 7 and the substrate P is filled with the liquid LQ.

In the present embodiment, when the substrate P is being irradiated with the exposure light EL, the liquid immersion space LS is formed such that a part of the region of the front surface of the substrate P that includes the projection region PR is covered with the liquid LQ. At least a part of an interface (a meniscus or an edge) LG of the liquid LQ is formed between the lower surface 40 and the front surface of the substrate P. That is, the exposure apparatus EX of the present embodiment adopts a local liquid immersion method.

Further, the liquid immersion member 3 includes a supply port 31 that supplies the liquid LQ. The supply port 31 is disposed on the upper side (+Z direction) of the first plate section 21. In the present embodiment, at least a part of the supply port 31 is disposed to face the third space S3. In the present embodiment, the supply port 31 is disposed on at least a part of the inner surface 20A. In addition, at least a part of the supply port 31 may be disposed to face the fourth space S4. The liquid LQ, which is supplied from the supply port 31, flows into the third space S3.

The liquid immersion member 3 includes a supply channel 35 that is connected to the supply port 31. At least a part of the supply channel 35 is formed inside the liquid immersion member 3. The supply port 31 is an opening disposed at the end of the supply channel 35. The supply port 31 is disposed at one end of the supply channel 35. The other end of the supply channel 35 is connected to a liquid supply device 36 through a channel formed by a supply tube.

The liquid supply device 36 is capable of sending the liquid LQ, which is clean and temperature adjusted. The liquid LQ, which is sent from the liquid supply device 36, is supplied to the supply port 31 through the supply channel 35.

The liquid immersion member 3 includes a collection channel 37 that is connected to the collection port 32. At least a part of the collection channel 37 is formed inside the liquid immersion member 3. The collection port 32 is an opening disposed at the end of the collection channel 37. The collection port 32 is disposed at one end of the collection channel 37. The other end of the collection channel 37 is connected to a liquid collection device 38 through a channel formed by a collection tube.

The liquid collection device 38 is capable of connecting the collection port 32 to a vacuum system, and is capable of suctioning the liquid LQ through the collection port 32. The liquid collection device 38 is capable of setting the collection channel 37 at a negative pressure. By setting the collection channel 37 at the negative pressure, the liquid LQ on the upper side of the substrate P is collected from the collection port 32 (the holes 33H of the porous member 33). The liquid LQ on the upper side of the substrate P flows into the collection channel 37 through the collection port 32 (the holes 33H). At least a part of the liquid LQ, which is collected from the collection port 32, flows in the collection channel 37. At least a part of the liquid LQ of the collection channel 37 is suctioned (collected) into the liquid collection device 38.

In the present embodiment, the control device 4 performs the operation for collecting the liquid LQ from the collection port 32 in conjunction with the operation for supplying the liquid LQ from the supply port 31. Thereby, it is possible to form the liquid immersion space LS using the liquid LQ between the terminal optical element 7 and the liquid immersion member 3 on one side and the substrate P (the object) on the other side.

In the present embodiment, in a state where the substrate P is substantially stopped, the size of the liquid immersion space LS is adjusted such that the second plate section 22 is disposed in the liquid immersion space LS. That is, in the present embodiment, in the state where the substrate P is substantially stopped, the size of the liquid immersion space LS is adjusted such that the entirety of the upper surface 22A and the lower surface 22B comes into contact into the liquid LQ of the liquid immersion space LS. In other words, the size of the liquid immersion space LS is adjusted such that the interface LG is disposed outside the outer edge Ed of the second plate section 22 in the radiation direction of the optical path K.

The control device 4 is capable of adjusting the size of the liquid immersion space LS in the XY plane by adjusting at least one of the amount of liquid supplied from the supply port 31 per unit time and the amount of the liquid collected from the collection port 32 per unit time. For example, the control device 4 is able to increase the liquid immersion space LS by increasing the amount of liquid supplied from the supply port 31, and is able to decrease the liquid immersion space LS by decreasing the amount of supplied liquid. Further, the control device 4 is able to increase the liquid immersion space LS by increasing the amount of liquid collected from the collection port 32, and is able to decrease the liquid immersion space LS by decreasing the amount of collected liquid.

Next, a method of exposing the substrate P using the exposure apparatus EX having the above-mentioned configuration will be described.

After the unexposed substrate P is carried (loaded) in the substrate holding section 9, the control device 4 forms the liquid immersion space LS by holding the liquid LQ between the lower surface 40 of the liquid immersion member 3 and the front surface of the substrate P such that the optical path K of the exposure light EL between the emission surface 6 of the terminal optical element 7 and the front surface of the substrate P is filled with the liquid LQ.

The control device 4 starts the process of exposing the substrate P. The control device 4 emits the exposure light EL from the illumination system IL, and exposes the mask M with the exposure light EL. Thereby, the exposure light EL, which is originated from the mask M illuminated with the exposure light EL, is emitted from the emission surface 6. The substrate P is irradiated with the exposure light EL, which is emitted from the emission surface 6, through the liquid LQ of the liquid immersion space LS. Thereby, the substrate P is exposed with the exposure light EL from the emission surface 6 through the liquid LQ of the liquid immersion space LS, and the image of the pattern of the mask M is projected onto the substrate P.

In the present embodiment, at least some of the liquid LQ, which is supplied from the supply port 31, is supplied to the third space S3 which the upper surface 21A of the first plate section 21 faces. Further, in the present embodiment, the inner edge Ec of the second plate section 22 is disposed inside the first plate section 21 in the radiation direction of the optical path K. Hence, at least some of the liquid LQ of the third space S3, which the upper surface 21A of the first plate section 21 faces, flows to the upper surface 22A of the second plate section 22 through the opening 21K of which at least a part is defined by the inner edge Ea of the first plate section 21.

At least some of the liquid LQ flowing from the third space S3 to the upper surface 22A through the opening 21K flows into the first space S1. Further, at least some of the liquid LQ flowing from the third space S3 to the upper surface 22A through the opening 21K flows into the second space S2. At least some of the liquid LQ of the first space S1 flows outward in the radiation direction of the optical path K. At least some of the liquid LQ of the second space S2 flows outward in the radiation direction of the optical path K. In addition, the connecting member 23C is a rod-like member which is disposed at a prescribed position in the first space S1, and is not an obstacle to the flow of the liquid LQ of the first space S1.

For example as shown in FIG. 5, at least some of the liquid LQ of the first space S1 and at least some of the liquid LQ of the second space S2 flow together outside the outer edge Ed of the second plate section 22. In the present embodiment, at least some of the liquid LQ of the first space S1 and at least some of the liquid LQ of the second space S2 flow together outside, for example, the outer edge Ed of the second plate section 22 and in a fifth space S5 between the lower surface 40 and the front surface of the substrate P.

In the present embodiment, the collection port 32 collects at least some of the liquid LQ from the first space S1 and the second space S2. In the present embodiment, the collection port 32 collects at least some of the liquid LQ from the first space S1 and the liquid LQ from the second space S2 which flow together between the collection port 32 (the lower surface 33B) and the substrate P.

However, in a state where the liquid immersion space LS is formed between the liquid immersion member 3 and the substrate P, the substrate P may move at a high velocity within the XY plane, or may move by a long distance. In such a case, there is a possibility that the liquid LQ flows outside the space between the liquid immersion member 3 and the substrate P.

The liquid immersion space LS is held by surface tension of the liquid LQ in the interface LG. When the substrate P moves at a high velocity or moves by a long distance in a state where the liquid immersion space LS is formed between the liquid immersion member 3 and the substrate P, there is a possibility that the momentum of the liquid LQ of the liquid immersion space LS increases. When the momentum of the liquid LQ increases, because of the momentum of the liquid LQ, there is a possibility that it is difficult to hold the liquid immersion space LS through the surface tension of the liquid LQ. As a result, the liquid LQ flows outside the space between the liquid immersion member 3 and the substrate P.

In the present embodiment, since the second plate section 22 is disposed, even when the substrate P moves at a high velocity or moves by a long distance within the XY plane in the state where the liquid immersion space LS is formed between the liquid immersion member 3 and the substrate P, it is possible to prevent the liquid LQ (a film, droplets, and the like) from flowing outside the space between the liquid immersion member 3 and the substrate P or from remaining on the substrate P.

Figure 6:
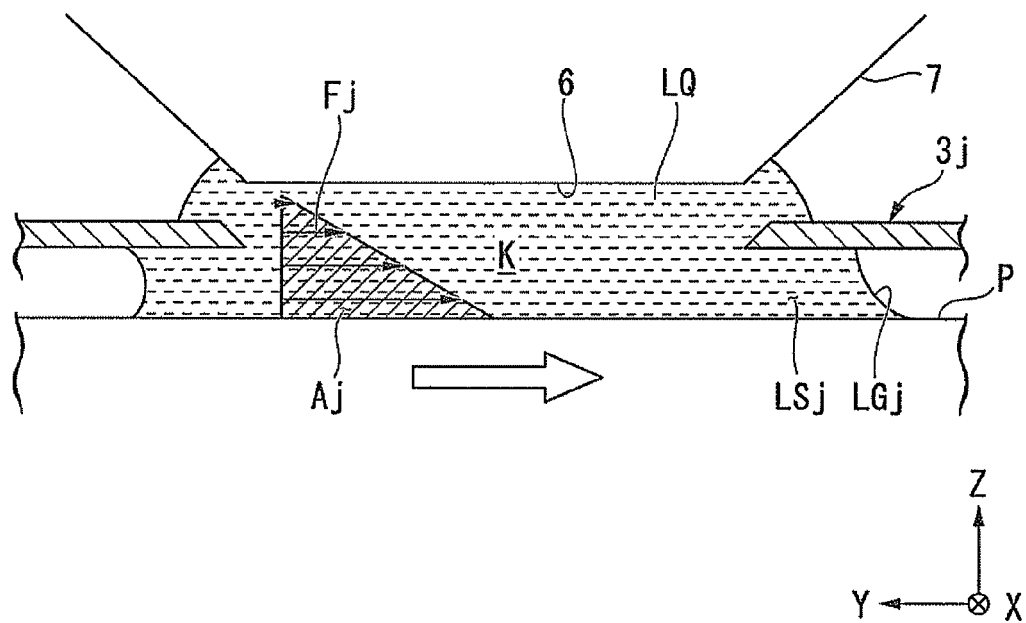
FIG. 6 is a schematic diagram illustrating a liquid immersion member according to a modified example.
Figure 7:
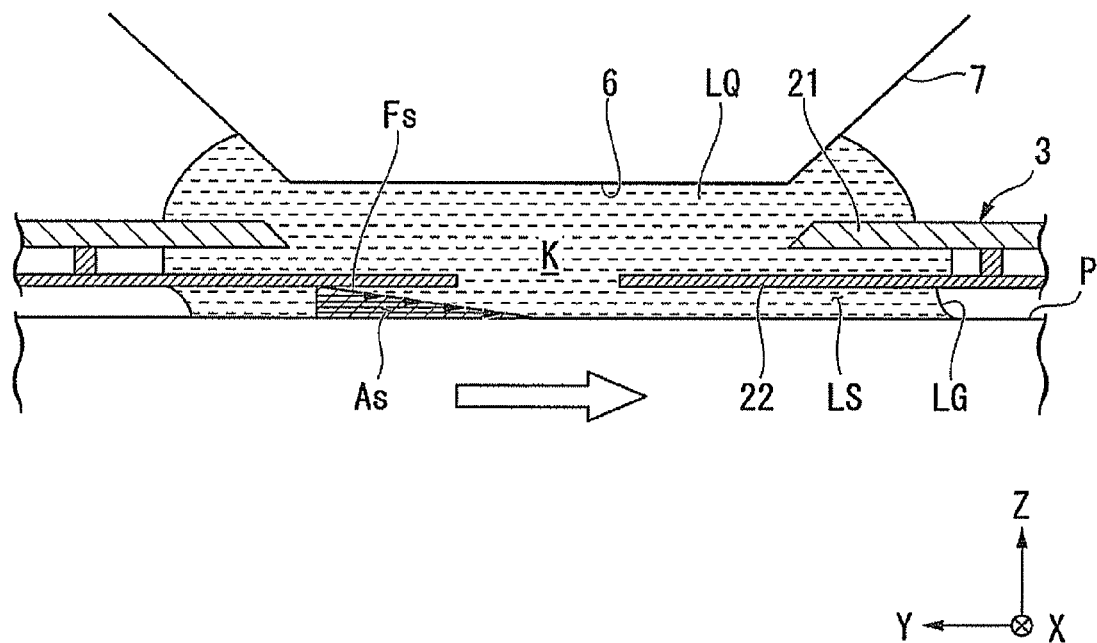
FIG. 7 is a schematic diagram illustrating the liquid immersion member according to the first embodiment.

FIG. 6 is a schematic diagram illustrating an example of the liquid LQ state in a case of moving the substrate P in the −Y direction in a state where a liquid immersion space LSj is formed between the substrate P and a liquid immersion member 3j according to a comparative example. FIG. 7 is a schematic diagram illustrating an example of the liquid LQ state in the case of moving the substrate P in the −Y direction in the state where the liquid immersion space LS is formed between the substrate P and the liquid immersion member 3 according to the present embodiment. The liquid immersion member 3j does not have the second plate section.

In FIGS. 6 and 7, when the substrate P moves in the state where the liquid immersion spaces LSj and LS are formed, for example, due to the effects and the like of the viscosity of the liquid LQ, the flows of the liquid LQ with velocity distribution as indicated by the arrows Fj and Fs are generated in the liquid LQ of the liquid immersion space LS.

The momentum of the liquid LQ is a product of a mass (a volume) of the liquid LQ and a velocity (a velocity of the flow) of the liquid LQ. Accordingly, in the examples respectively shown in FIGS. 6 and 7, the momentum of the liquid LQ of the liquid immersion space LS based on the movement of the substrate P corresponds to areas Aj and As.

That is, since the second plate section 22 is disposed, it is possible to prevent the momentum of the liquid LQ of the liquid immersion space LS based on the movement of the substrate P from increasing. In other words, since the second plate section 22 is disposed, it is possible to suppress the mass (the volume) of the liquid LQ on which the substrate P is having an effect.

In the example shown in FIG. 6, the momentum of the liquid LQ acting on the interface LGj on the −Y side with respect to the optical path K is large. As a result, because of the surface tension of the liquid LQ in the interface LGj, it becomes difficult to hold the liquid immersion space LSj, and thus there is a high possibility that the liquid LQ flows out.

Meanwhile, in the example shown in FIG. 7, the momentum of the liquid LQ acting on the interface LG on the −Y side with respect to the optical path K is small. Hence, it is possible to hold the liquid immersion space LS through the surface tension of the liquid LQ in the interface LG.

FIG. 5 shows an example of the liquid LQ state in the case of moving the substrate P in the −Y direction in the state where the liquid immersion space LS is formed between the substrate P and the liquid immersion member 3. In FIG. 5, when the substrate P moves at a high velocity in the −Y direction, in the liquid immersion space LS, the flows of the liquid LQ as indicated by the arrows Fa, Fb, Fe, Fd, and Fe of FIG. 5 are generated. In the present embodiment, since the second plate section 22 is disposed, even when the substrate P moves at a high velocity in the −Y direction in the state where the liquid immersion space LS is formed between the substrate P and the liquid immersion member 3, the moving substrate P has less effect on the liquid LQ of the first space S1. The velocity of flow of the liquid LQ in the first space S1 is a value corresponding to the velocity of flow of the liquid LQ flowing from for example the opening 21K to the upper surface 22A. In the first space S1, as indicated by the arrow Fa, the liquid LQ is capable of freely flowing.

Meanwhile, the moving substrate P has an effect on the liquid LQ of the second space S2. In the second space S2, due to the effects and the like of the viscosity of the liquid LQ, the flow of the liquid LQ corresponding to the movement of the substrate P is generated. The velocity of flow of the liquid LQ in the second space S2 is a value corresponding to the movement velocity of the substrate P. In the second space S2, as indicated by the arrow Fb, the liquid LQ flows at a high velocity in response to the movement velocity of the substrate P.

In the present embodiment, the gap G2 is small, and the volume (the mass) of the liquid LQ in the second space S2 is small. Hence, the momentum of the liquid LQ of the second space S2 is relatively small.

At least some of the liquid LQ of the first space S1 and at least some of the liquid LQ of the second space S2 flow together in the fifth space S5 between the lower surface 40 (the collection port 32) and the substrate P. The velocity of flow of the liquid LQ flowing from the first space S1 into the fifth space S5 is low, and the momentum thereof is small. The velocity of flow of the liquid LQ flowing from the second space S2 into the fifth space S5 is high, but the mass thereof is small, and thus the momentum thereof is small. The liquid LQ from the first space S1 and the liquid LQ from the second space S2 flow together in the fifth space S5, whereby the flows of the liquid LQ indicated by for example arrows Fc, Fd, and Fe are generated in the fifth space S5. Hence, it is possible to decrease the momentum of the liquid LQ acting on the interface LG on the −Y side with respect to the optical path K in FIG. 5. Accordingly, it is possible to hold the liquid immersion space LS through the surface tension of the liquid LQ in the interface LG.

Further, the liquid LQ from the first space S1 and the second space S2 flowing together in the fifth space S5 is collected from the collection port 32. Thereby, the flow of the liquid LQ as indicated by for example the arrow Fd of FIG. 5 is generated. Accordingly, it is possible to further increase the momentum of the liquid LQ acting on the interface LG.

In the example of the above description, the movable object, which forms the liquid immersion space LS between itself and the liquid immersion member 3, is the substrate P. As described above, the object may be, for example, the substrate stage 2 (plate member T).

As described above, according to the present embodiment, since the second plate section 22 is provided, even when the substrate P moves at a high velocity or moves by a long distance in the state where the liquid immersion space LS is formed, it is possible to prevent the liquid LQ from flowing out or from remaining. Accordingly, it is possible to prevent exposure failures from occurring and prevent a defective device from being produced.

That is, in the present embodiment, the second plate section 22 is disposed in the space between the first plate section 21 and the moving substrate P so as to partition the space into the first space S1, where the liquid LQ on which the moving substrate P has less effect flows, and the second space S2 where the liquid LQ on which the moving substrate P has an effect flows. Thus, it is possible to decrease the momentum of the liquid LQ acting on the interface LG.

In the present embodiment, since the gap G2 is smaller than the gap G1, it is possible to decrease the mass (the volume) of the liquid LQ of the second space S2 on which the moving substrate P has an effect. Hence, it is possible to decrease the momentum of the liquid LQ acting on the interface LG.

Further, in the present embodiment, the collection port 32 is disposed outside the second plate section 22 in the radiation direction of the optical path K. Therefore, it is possible to generate the flow of the liquid LQ as indicated by the arrow Fd of FIG. 5, that is, the flow of the liquid LQ which is not directed toward the interface LG and is directed toward the collection port 32 (upward). Accordingly, it is possible to decrease the momentum of the liquid LQ acting on the interface LG.

In addition, a part of the collection port 32 may be disposed inside the outer edge Ed of the second plate section 22 in the radiation direction of the optical path K. That is, at least a part of the collection port 32 may be formed outside the outer edge Ed of the second plate section 22.

Further, in the present embodiment, the inner edge Ec of the second plate section 22 is disposed inside the first plate section 21 in the radiation direction of the optical path K. Therefore, at least some of the liquid LQ of the third space S3 is capable of flowing to the upper surface 22A through the opening 21K. Thereby, it is possible to decrease the momentum of the liquid LQ acting on the object which is disposed in the projection region PR. That is, when the liquid LQ of the third space S3 directly flows to the object which is disposed in the projection region PR through the opening 21K, there is a possibility that, for example, the liquid LQ with a high velocity of flow reaches the object. As a result, the momentum of the liquid LQ acting on the object is likely to increase. When for example the boundary (gap) between the substrate P and the plate member T is disposed in the projection region PR, when the momentum of the liquid LQ acting on the boundary increases, there is a high possibility that the liquid LQ infiltrates the boundary. In the present embodiment, the inner edge Ec of the second plate section 22 is disposed inside the first plate section 21 in the radiation direction of the optical path K. Thus, it is possible to decrease the momentum of the liquid LQ acting on the object.

In addition, in the present embodiment, the external shape of the lower surface 22B of the second plate section 22 is substantially the same as the external shape of the lower surface 21B of the first plate section 21, but may be different therefrom. For example, the size of the lower surface 21B in the Y axis direction may be different from the size of the lower surface 22B. Further, the size of the lower surface 21B in the X axis direction may be different from the size of the lower surface 22B.

Figure 8:
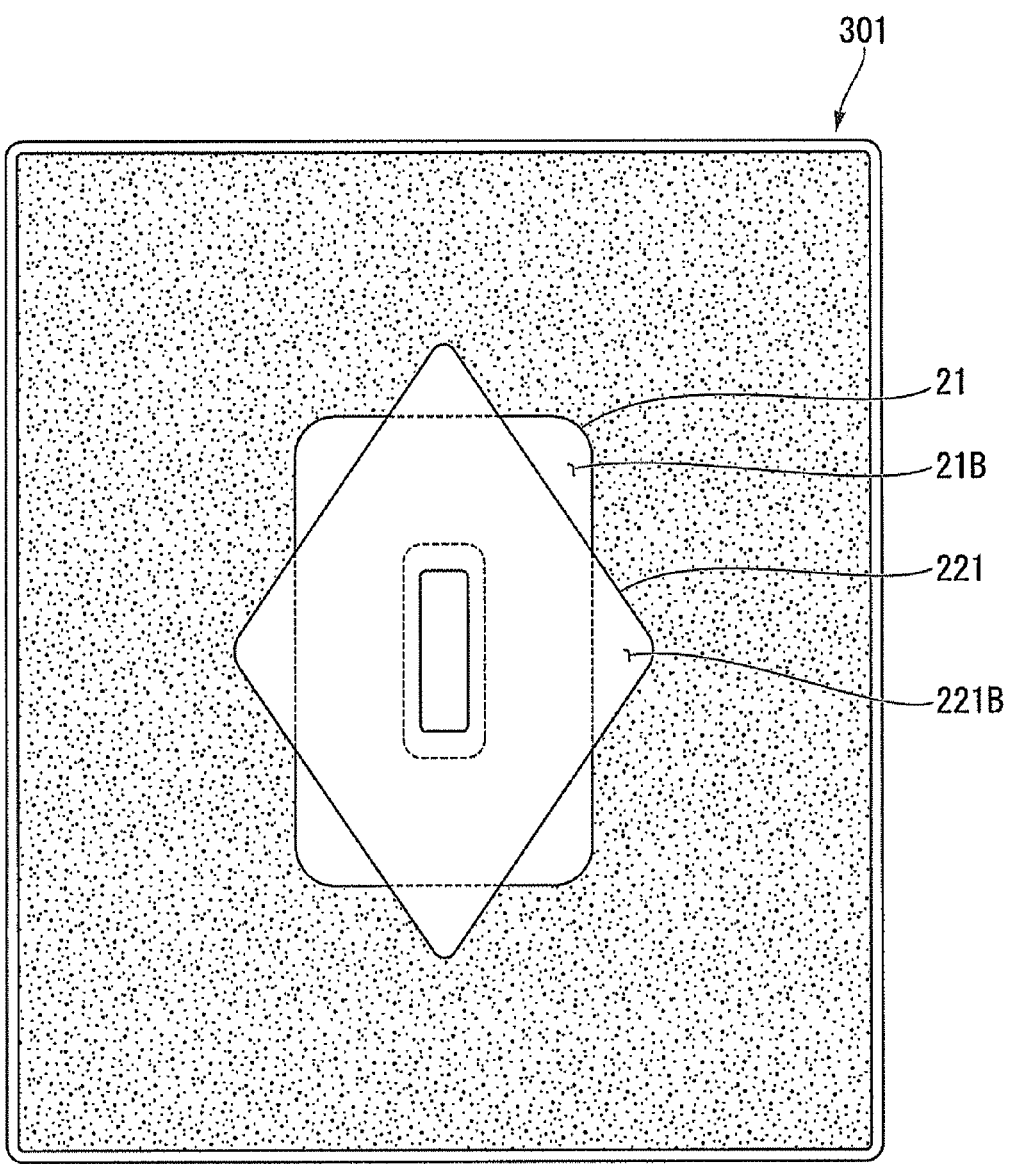
FIG. 8 is a diagram illustrating an example of the liquid immersion member according to the first embodiment as viewed from the lower side thereof.

For example, similarly to the liquid immersion member 301 shown in FIG. 8, the lower surface 221B of the second plate section 221 may be substantially rectangular (rhombic), and the side of the lower surface 221B may be disposed to intersect the side of the lower surface 21B of the first plate section 21.

Further, similarly to the liquid immersion member 302 shown in FIG. 9, the sides of the lower surface 222B of the second plate section 222 on the +Y and −Y sides with respect to the optical path K may include a curve (a curvature). It is apparent that the sides of the lower surface 222B on the +X and −X sides with respect to the optical path K may include a curve (a curvature).

Figure 10:
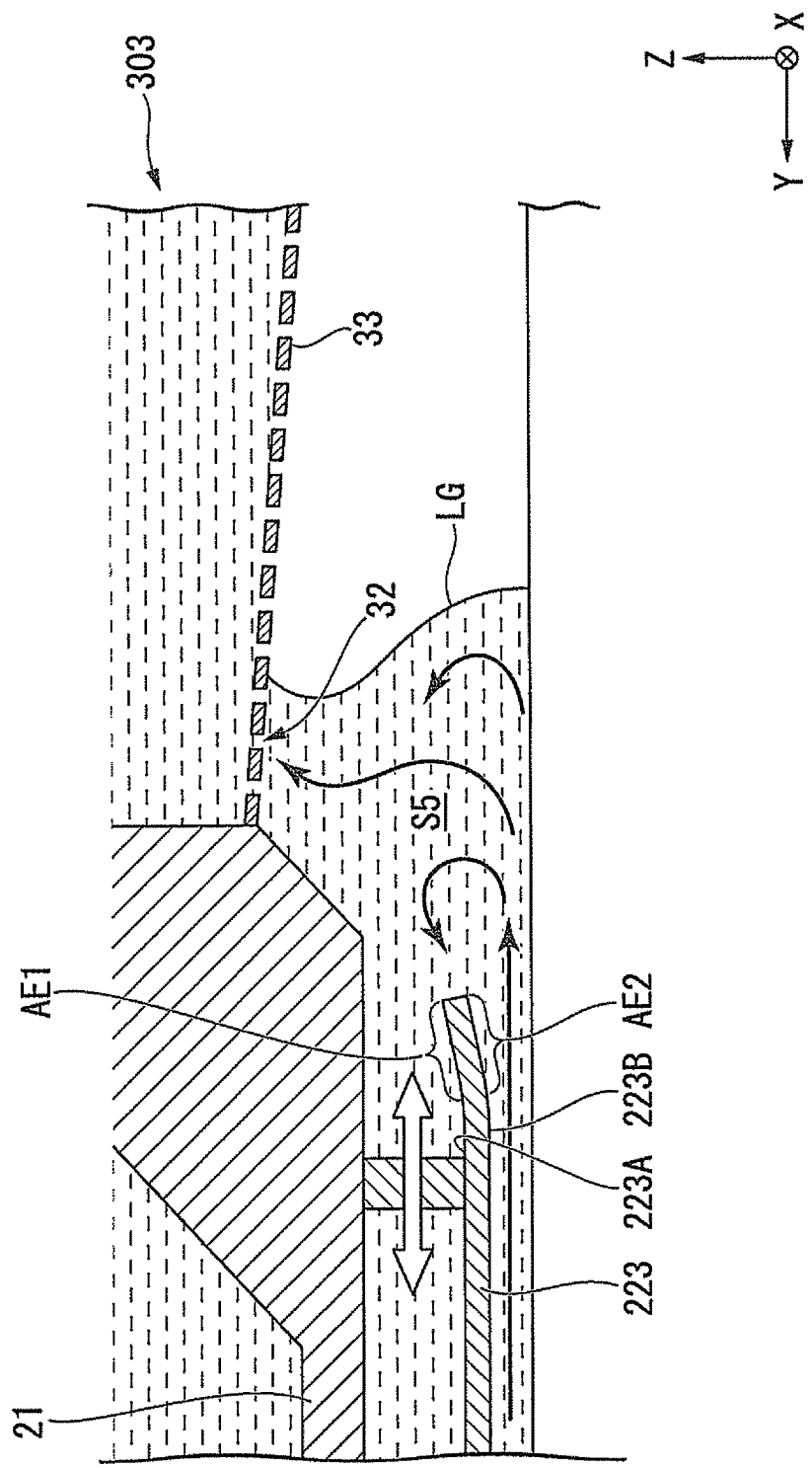
FIG. 10 is a side cross-sectional view illustrating a part of an example of the liquid immersion member according to the first embodiment.

In addition, in the above-mentioned embodiment, the upper surface 22A and the lower surface 22B of the second plate section 22 is flat, and the upper surface 22A is parallel to the lower surface 22B. However, for example, similarly to the liquid immersion member 303 shown in FIG. 10, an outer peripheral region AE1 of an upper surface 223A of a second plate section 223 may approach the first plate section 21 outward in the radiation direction of the optical path K. In other words, the outer peripheral region AE1 may be inclined upward (+Z direction) and outward in the radiation direction of the optical path K. In the example shown in FIG. 10, the upper surface 223A in the outer peripheral region AE1 includes a curved surface. In the present embodiment, the outer peripheral region AE1 of the upper surface 223A includes an annular region including the outer edge of the upper surface 223A. The size of the outer peripheral region AE1 is smaller than the size of the region other than the outer peripheral region AE1 in the radiation direction of the optical path K. In addition, the region other than the outer peripheral region AE1 includes an inner peripheral region including the inner edge of the upper surface 223A. The inner peripheral region is an annular region including the inner edge of the upper surface 223A.

The outer peripheral region AE1 of the upper surface 223A is inclined (bendable) to approach the first plate section 21 (the collection port 32) outward in the radiation direction of the optical path K. Thereby, in the fifth space S5, it is possible to generate the flow of the liquid LQ directed toward the upper side (the collection port 32). Thereby, it is possible to further decrease the momentum of the liquid LQ acting on the interface LG.

In addition, the outer peripheral region AE2 of the lower surface 223B of the second plate section 223 may be bendable and may be inclined upward and outward in the radiation direction of the optical path K. In such a state, in the fifth space S5, it is possible to generate the flow of the liquid LQ directed toward the upper side (the collection port 32 side).

Second Embodiment

Next, a second embodiment will be described. In the following description, components the same as or equivalent to those of the above-mentioned first embodiment are represented by the same reference signs, and the description thereof will be simplified or omitted.

Figure 11:
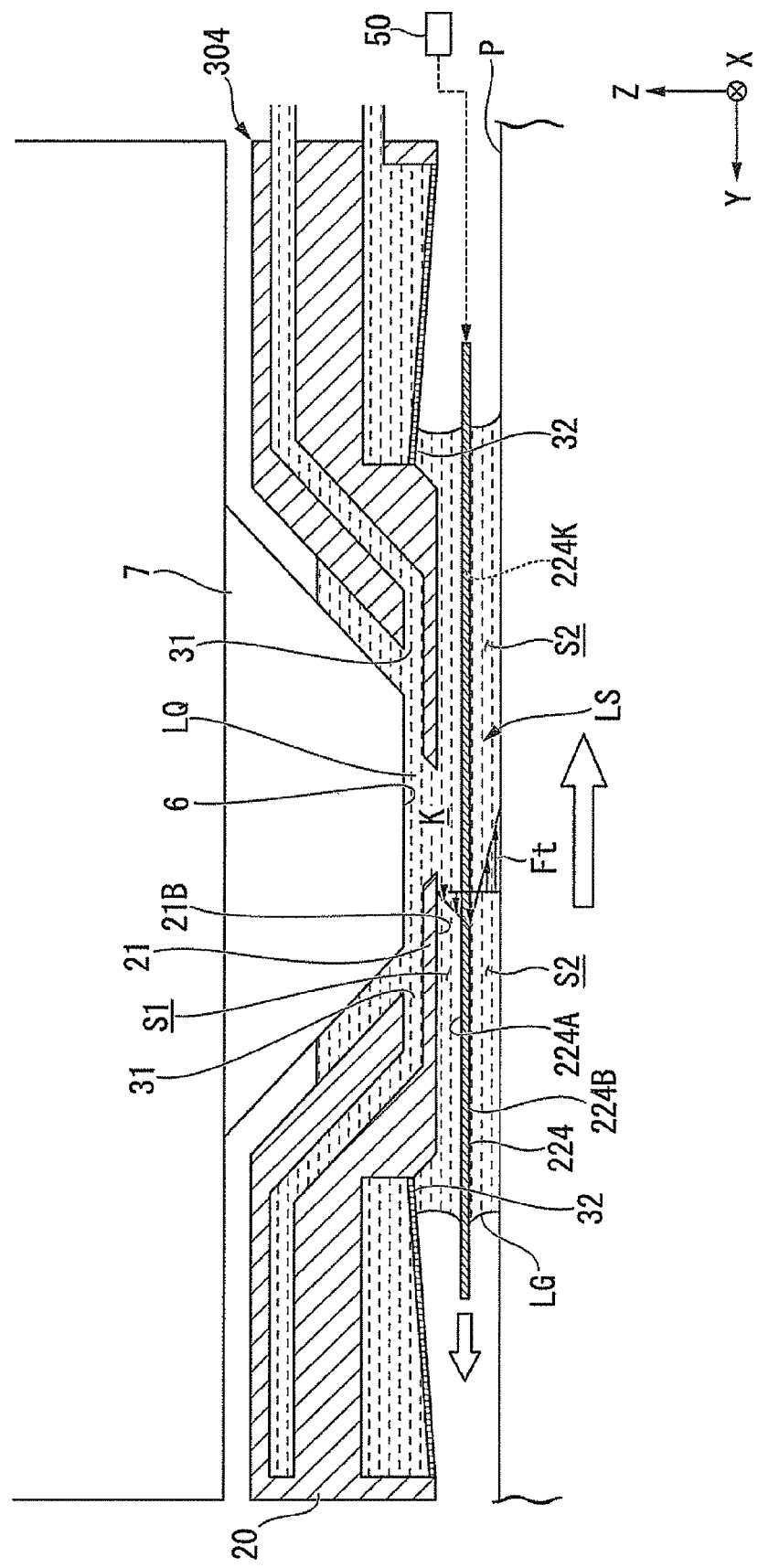
FIG. 11 is a schematic diagram illustrating a liquid immersion member according to a second example.

FIG. 11 is a schematic diagram illustrating a liquid immersion member 304 according to the second example. The liquid immersion member 304 includes: the main body section 20; the first plate section 21; and a second plate section 224 which is disposed at least partially around the optical path K, and has an upper surface 224A, which is opposed to at least a part of the lower surface 21B of the first plate section 21, and a lower surface 224B which can be opposed to the substrate P. The feature of the second embodiment different from the above-mentioned first embodiment is that the second plate section 224 is moved by a driving system 50.

In the present embodiment, the main body section 20 and the first plate section 21 are separated from the second plate section 224. The second plate section 224 is moved by the driving system 50 in substantially parallel to the lower surface 21B of the first plate section 21.

In the present embodiment, the driving system 50 moves the second plate section 224 on the basis of the movement condition of the substrate P. In the present embodiment, the driving system 50 moves the second plate section 224 when the substrate P moves. Further, the driving system 50 moves the second plate section 224 in a direction opposite to the movement direction of the substrate P. In the example shown in FIG. 11, in a state where the substrate P is moved in the −Y direction, the second plate section 224 is moved in the +Y direction. Further, the driving system 50 moves the second plate section 224 at a movement velocity lower than the movement velocity of the substrate P. For example, the movement velocity of the second plate section 224 is about ½ of the movement velocity of the substrate P.

The second plate section 224 has an opening 224K through which the exposure light EL emitted from the emission surface 6 can be transmitted. In the present embodiment, the opening 224K is long in the Y axis direction. Thereby, when the substrate P is irradiated with the exposure light EL while the substrate P is moved in the Y axis direction, the exposure light EL emitted from the emission surface 6 can be transmitted through the opening 224K.

In the state where the liquid immersion space LS is formed, the second plate section 224 moves in accordance with the movement of the substrate P. Thereby, in the liquid LQ of the liquid immersion space LS, the flow of the liquid LQ with velocity distribution as indicated by the arrow Ft of FIG. 11 are generated. In the first space S1 which the upper surface 224A of the second plate section 224 faces, the flow of the liquid LQ directed to the +Y direction is generated. In the second space S2 which the lower surface 224B faces, the flow of the liquid LQ directed to the −Y direction is generated. Thereby, the liquid LQ of the first space S1 and the liquid LQ of the second space S2 flow together in the vicinity of the interface LG on the +Y side with respect to the optical path K for example, whereby it is possible to sufficiently decrease the momentum of the liquid LQ acting on the interface LG on the +Y side. It is the same for the interface LG on the −Y side with respect to the optical path K.

In addition, in the respective embodiments above, the lower surface 21B of the first plate section 21 may be provided with a liquid supply port that supplies the liquid LQ between the first plate section 21 and the second plate section 22. Further, a through-hole, through which a space faced by the upper surface 21A of the first plate section 21 communicates with a space faced by the lower surface 21B, may be provided on the first plate section 21.

Further, in the respective embodiments above, the liquid immersion member (3 or the like) may be movable in at least one direction of the X axis direction, Y axis direction, Z axis direction, θX direction, θY direction, and θZ direction.

Furthermore, in the respective embodiments above, the second plate section 22 may be movable, relative to the first plate section 21, in at least one direction of the Z axis direction, θX direction, θY direction, and θZ direction.

Further, in the respective embodiments mentioned above, a gas supply port, which supplies gas to the outside of the collection port 32 in the radiation direction of the optical path K, may be provided. In this case, due to the supplied gas, it is possible to prevent the liquid LQ from remaining on the object (the substrate P or the like) opposed to the liquid immersion member (3 or the like).

Furthermore, in the respective embodiments mentioned above, the optical path K on the emission (the image plane) side of the terminal optical element 7 of the projection optical system PL is filled with the liquid LQ. However, as disclosed in for example PCT International Publication No. 2004/019128, it may be possible to employ the projection optical system PL in which the optical path K on the incident side (the object surface side) of the terminal optical element 7 is also filled with the liquid LQ.

Furthermore, in the respective embodiments mentioned above, water is used as the liquid LQ, but a liquid other than water may be used. Preferably, the liquid LQ is a liquid that is transmissive with respect to the exposure light EL, has a high refractive index with respect to the exposure light EL, and is stable with respect to the projection optical system PL or the film of the photosensitive material (the photoresist) or the like that forms the front surface of the substrate P. For example, the liquid LQ may be a fluorine-based liquid such as hydrofluoro-ether (HFE), perfluorinated polyether (PFPE), or Fomblin® oil. In addition, the liquid LQ may be any of various fluids, for example, a supercritical fluid.

In addition, the substrate P in each embodiment mentioned above is a semiconductor wafer for fabricating semiconductor devices, but may be, for example, a glass substrate for display devices, a ceramic wafer for thin film magnetic heads, or the original plate of a mask or a reticle (synthetic quartz or a silicon wafer) used by an exposure apparatus.

As the exposure apparatus EX, it may be possible to employ not only a step-and-scan type scanning exposure apparatus (a scanning stepper), which scans and exposes the pattern of the mask M by synchronously moving the mask M and the substrate P, but also a step-and-repeat type projection exposure apparatus (a stepper), which performs the one-shot exposure on the pattern of the mask M in a state where the mask M and the substrate P remain stationary and then sequentially steps the substrate P.

Furthermore, in the exposure of the step-and-repeat type, the one-shot exposure may be performed on the substrate P in the following manner; in a state where the first pattern and the substrate P are substantially stationary, a reduced image of a first pattern is transferred onto the substrate P by using the projection optical system PL, and subsequently in a state where the second pattern and the substrate P are substantially stationary, a reduced image of a second pattern is transferred onto the substrate P so as to partially overlap with the first pattern (a stitching type one-shot exposure apparatus). In addition, as the stitching type exposure apparatus, it may also be possible to employ a step-and-stitch type exposure apparatus that transfers at least two patterns onto the substrate P such that they partially overlap with each other and sequentially steps the substrate P.

Further, as disclosed in for example U.S. Pat. No. 6,611,316, it may also be possible to employ an exposure apparatus that combines on the substrate P the patterns of two masks through a projection optical system and double exposes, substantially simultaneously, a single shot region on the substrate P using a single scanning exposure. In addition, it may also be possible to employ a proximity type exposure apparatus, a mirror projection aligner, and the like.

Furthermore, the exposure apparatus EX may be a twin stage type exposure apparatus, which includes a plurality of substrate stages, as disclosed in for example U.S. Pat. Nos. 6,341,007, 6,208,407, and 6,262,796.

Further, as disclosed in for example U.S. Pat. No. 6,897,963 and U.S. Patent Application Publication No. 2007/0127006, the exposure apparatus EX may be an exposure apparatus that is provided with a substrate stage that holds a substrate and a measurement stage that is equipped with a reference member, in which a reference mark is formed, and/or various photoelectric sensors are mounted, and that does not hold the substrate to be exposed. Furthermore, it may also be possible to employ an exposure apparatus that includes a plurality of the substrate stages and the measurement stages. In this case, the movable object, which forms the liquid immersion space LS between itself and the liquid immersion member, includes the measurement stage.

The types of the exposure apparatus EX are not limited to a semiconductor device fabrication exposure apparatus that exposes the pattern of a semiconductor device on the substrate P. However, it may also be possible to employ an exposure apparatus used for fabricating, for example, liquid crystal display devices or displays, or an exposure apparatus for fabricating thin film magnetic heads, image capturing devices (CCDs), micromachines, MEMS, DNA chips, or reticles and masks.

In addition, in the respective embodiments mentioned above, the position information of each of the stages is measured using an interferometer system, but the present invention is not limited thereto. For example, it may be possible to employ an encoder system that detects a scale (a diffraction grating) provided to each of the stages.

Furthermore, in the respective embodiments mentioned above, the optically transmissive mask M, in which a prescribed shielding pattern (or phase pattern or dimming pattern) is formed on an optically transmissive substrate, is used. However, instead of such a mask, as disclosed in for example U.S. Pat. No. 6,778,257, it may be possible to use a variable shaped mask (also called an electronic mask, an active mask, or an image generator), in which a transmissive pattern, a reflective pattern, or a light-emitting pattern is formed based on electronic data of the pattern to be exposed. In addition, instead of a variable shaped mask that includes a non-emissive type image display device, a pattern forming apparatus that includes a self-luminous type image display device may be provided.

In the respective embodiments mentioned above, the exposure apparatus including the projection optical system PL was described as an example. However, the present invention may be applicable to an exposure apparatus and an exposing method that does not use the projection optical system PL. For example, the liquid immersion space is formed between the substrate and an optical member such as a lens, and the exposure light EL can be irradiated onto the substrate P through that optical member.

Further, as disclosed in for example PCT International Publication No. 2001/035168, the present invention may also be applicable to an exposure apparatus (a lithographic system) that exposes the substrate P with a line-and-space pattern by forming interference fringes on the substrate P.

The exposure apparatus EX according to the embodiments mentioned above is manufactured by assembling various subsystems such that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the connection of mechanical components, the wiring and connection of electrical circuits, and the piping and connection of the pneumatic circuits among the various subsystems. It is needless to say that, prior to performing the process of assembling the exposure apparatus from these various subsystems, there are also the processes of assembling each individual subsystem. After the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room, in which the temperature, the cleanliness level, and the like are controlled.

Figure 12:
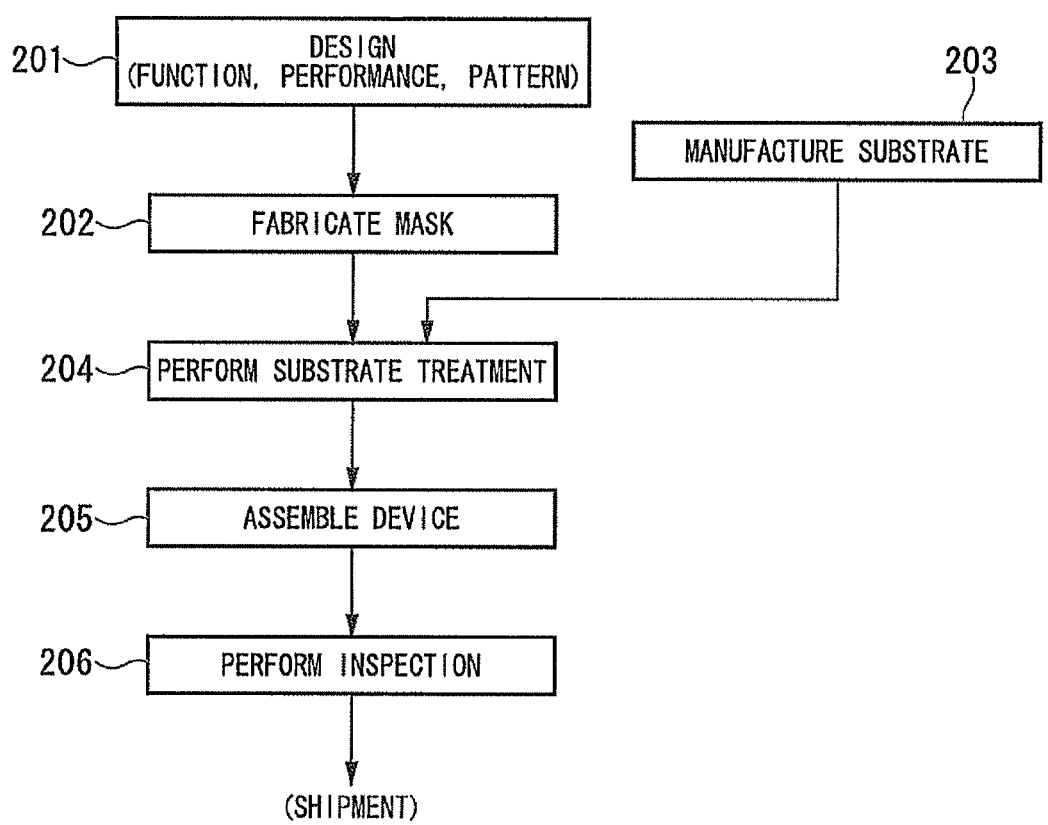
FIG. 12 is a flowchart illustrating an example of a process of manufacturing micro devices.

As shown in FIG. 12, a micro device, such as a semiconductor device, is manufactured by: a step 201 that designs the functions and performance of the micro device; a step 202 that fabricates the mask (the reticle) based on this designing step; a step 203 that manufactures the substrate, which is the base material of the device; a substrate treatment step 204 that includes a substrate treatment (an exposure process) that includes, in accordance with the embodiments mentioned above, exposing the substrate with the exposure light emitted from the pattern of the mask and developing the exposed substrate; a device assembling step 205 (which includes fabrication processes such as dicing, bonding, and packaging processes); an inspecting step 206; and the like.

In addition, the features of each embodiment mentioned above can be combined as appropriate. In addition, there are also cases in which some of the components are not used. In addition, each disclosure of every Japanese published patent application and U.S. patent related to the exposure apparatus recited in the respective embodiments mentioned above, the modified examples, and the like is hereby incorporated by reference in its entirety to the extent permitted by the national laws and regulations.

DESCRIPTION OF THE REFERENCE SYMBOLS

2: SUBSTRATE STAGE
3: LIQUID IMMERSION MEMBER
4: CONTROL APPARATUS
6: EMISSION SURFACE
21: FIRST PLATE SECTION
21A: UPPER SURFACE
21B: LOWER SURFACE
21K: OPENING
22: SECOND PLATE SECTION
22A: UPPER SURFACE
22B: LOWER SURFACE
22K: OPENING
23: SUPPORTING MECHANISM
23C: CONNECTING MEMBER
31: SUPPLY PORT
32: COLLECTION PORT
33: POROUS MEMBER
33H: HOLE
50: DRIVING SYSTEM
AE1: OUTER PERIPHERAL REGION
Ea: INNER EDGE
Eb: OUTER EDGE
Ec: INNER EDGE
Ed: OUTER EDGE
EL: EXPOSURE LIGHT
G1: GAP
G2: GAP
G3: GAP
K: OPTICAL PATH
LQ: LIQUID
LS: LIQUID IMMERSION SPACE
P: SUBSTRATE
PL: PROJECTION OPTICAL SYSTEM
S1: FIRST SPACE
S2: SECOND SPACE
S3: THIRD SPACE

The invention claimed is:

1. A liquid immersion member that forms a liquid immersion space between said member and a movable object such that an optical path of exposure light is filled with liquid, the liquid immersion member comprising:
    a first member that is disposed at least partially around the optical path;
    a second member that is disposed at least partially around the optical path, and has (1) an upper surface, which is opposed to at least a part of a lower surface of the first member, and (2) a lower surface, which can be opposed to the object; and a collection port that is disposed outside the first member with respect to the optical path, can be at least partially opposed to the object, and collects at least some of the liquid from (i) a first space, which the upper surface of the second member faces, and (ii) a second space which the lower surface of the second member faces, wherein a liquid-flow-passage exists between the upper surface of the second member and the lower surface of the first member at a radially outer edge of the second member, such that at least some of the liquid flows from the first space through the liquid-flow-passage to the collection port.

2. The liquid immersion member according to claim 1, wherein at least a part of the collection port is disposed radially outward of the second member relative to the optical path.

3. The liquid immersion member according to claim 1, wherein the collection port collects at least a part of the liquid from the second space and the liquid from the first space confluent between the collection port and the object.

4. The liquid immersion member according to claim 1, wherein an inner edge of the second member is disposed radially inward of the first member relative to the optical path.

5. The liquid immersion member according to claim 4, wherein at least some of the liquid of a third space, which an upper surface of the first member faces, flows on the upper surface of the second member through a first opening which is at least partly defined by an inner edge of the first member.

6. The liquid immersion member according to claim 1, wherein the lower surface of the first member is substantially parallel to the upper surface of the second member.

7. The liquid immersion member according to claim 1, wherein an outer peripheral region of the upper surface of the second member approaches the lower surface of the first member relative to an inner peripheral region of the upper surface of the second member.

8. The liquid immersion member according to claim 1, wherein a first gap between the lower surface of the first member and the upper surface of the second member is larger than a second gap between the lower surface of the second member and a surface of the object.

9. The liquid immersion member according to claim 1, wherein an external shape of the lower surface of the second member is different from an external shape of the lower surface of the first member.

10. The liquid immersion member according to claim 1, wherein at least a part of the upper surface and the lower surface of the second member is lyophilic to the liquid.

11. The liquid immersion member according to claim 1, further comprising a supporting mechanism that supports the second member such that the second member is disposed at a prescribed position relative to the first member.

12. The liquid immersion member according to claim 11, wherein the supporting mechanism includes a connecting member that connects the second member to the first member.

13. The liquid immersion member according to claim 1, wherein the exposure light is emitted from an emission surface of a projection optical system, and wherein a first gap between the lower surface of the first member and the upper surface of the second member is larger than a second gap between the lower surface of the second member and the surface of the object which is disposed below the emission surface of the projection optical system.

14. The liquid immersion member according to claim 1, wherein the second member is moved by a driving system.

15. The liquid immersion member according to claim 13, wherein the second member is substantially parallel to the lower surface of the first member.

16. The liquid immersion member according to claim 1, further comprising a porous member that is disposed at the collection port, wherein the liquid is collected through holes of the porous member.

17. The liquid immersion member according to claim 1, further comprising a supply port that is disposed above the first member so as to supply the liquid.

18. An exposure apparatus that exposes a substrate with exposure light through liquid, the exposure apparatus comprising the liquid immersion member according to claim 1.

19. The exposure apparatus according to claim 18, wherein in a state where a liquid immersion space is formed between the liquid immersion member and the object, the object is moved within a prescribed plane which is substantially parallel to the lower surface of the second member.

20. The exposure apparatus according to claim 19, wherein the moved object includes at least one of the substrate and a substrate stage which is moved while holding the substrate.

21. A device manufacturing method comprising:
exposing a substrate using the exposure apparatus according to claim 18; and
developing the exposed substrate.

22. An exposure method of exposing a substrate with exposure light through liquid, the exposure method comprising:
forming a liquid immersion space such that an optical path of exposure light between an emission surface of an optical member and a front surface of the substrate is filled with the liquid;
irradiating the front surface of the substrate with the exposure light from the emission surface through the liquid of the liquid immersion space; and
collecting at least some of the liquid from (1) a first space between a lower surface of a first member, which is disposed at least partially around the optical path, and an upper surface of a second member, which is disposed at least partially around the optical path, and (2) a second space between a lower surface of the second member and the front surface of the substrate, through a collection port which is disposed outside the first member with respect to the optical path and can be at least partially opposed to the substrate,
wherein a liquid-flow-passage exists between the upper surface of the second member and the lower surface of the first member at a radially outer edge of the second member, such that at least some of the liquid flows from the first space through the liquid-flow-passage to the collection port.

23. A device manufacturing method comprising:
exposing a substrate using the exposure method according to claim 22; and
developing the exposed substrate.

* * * * *